US012753512B2

(12) United States Patent
Nakatani et al.

(10) Patent No.: US 12,753,512 B2
(45) Date of Patent: Oct. 6, 2026

(54) METHOD OF PROCESSING SUBSTRATE, METHOD OF MANUFACTURING SEMICONDUCTOR DEVICE, RECORDING MEDIUM, AND SUBSTRATE PROCESSING APPARATUS

(71) Applicant: Kokusai Electric Corporation, Tokyo (JP)

(72) Inventors: Kimihiko Nakatani, Toyama (JP); Takayuki Waseda, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 19/022,337

(22) Filed: Jan. 15, 2025

(65) Prior Publication Data

US 2025/0305143 A1 Oct. 2, 2025

(30) Foreign Application Priority Data

Mar. 26, 2024 (JP) ................................ 2024-049964

(51) Int. Cl.
*H01L 21/768* (2006.01)
*C23C 16/455* (2006.01)
*C23C 16/52* (2006.01)

(52) U.S. Cl.
CPC ........ *C23C 16/52* (2013.01); *C23C 16/45563* (2013.01)

(58) Field of Classification Search
CPC .......................... C23C 16/52; C23C 16/45563
See application file for complete search history.

(56) References Cited

U.S. PATENT DOCUMENTS

2016/0225607 A1 8/2016 Yamamoto et al.
2017/0067159 A1 3/2017 Isobe et al.
2017/0092535 A1* 3/2017 Kimihiko ............ H10W 20/037
2020/0024731 A1 1/2020 Horita et al.
2020/0312655 A1* 10/2020 Nishida ............... H10P 14/6512
2020/0407851 A1 12/2020 Hiramatsu et al.
2022/0170154 A1 6/2022 Hanashima et al.

FOREIGN PATENT DOCUMENTS

JP 2016-143681 A 8/2016
JP 2017-054925 A 3/2017
JP 2020-167400 A 10/2020
KR 20200011022 A 1/2020
KR 20200118181 A 10/2020
KR 20220074787 A 6/2022
WO 2019/180905 A1 9/2019

OTHER PUBLICATIONS

Korean Office Action issued on Oct. 19, 2025 for Korean Patent Application No. 10-2025-0006586.

* cited by examiner

*Primary Examiner* — Nathan T Leong
(74) *Attorney, Agent, or Firm* — Volpe Koenig

(57) ABSTRACT

There is provided a technique that includes: (a) arranging a plurality of first substrates, each including a surface on which a concave structure is formed, in multiple stages within a first region along a direction perpendicular to the surface; (b) supplying a first processing gas toward at least a portion of the first region; and (c) supplying an inert gas different from the first processing gas toward the at least a portion of the first region, wherein the first region includes a first zone including one end of the first region, a third zone including the other end of the first region, and a second zone located between the first zone and the third zone.

18 Claims, 20 Drawing Sheets

METHOD OF PROCESSING SUBSTRATE, METHOD OF MANUFACTURING SEMICONDUCTOR DEVICE, RECORDING MEDIUM, AND SUBSTRATE PROCESSING APPARATUS

CROSS-REFERENCE TO RELATED APPLICATION

This application is based upon and claims the benefit of priority from Japanese Patent Application No. 2024-049964, filed on Mar. 26, 2024, the entire contents of which are incorporated herein by reference.

TECHNICAL FIELD

The present disclosure relates to a method of processing a substrate, a method of manufacturing a semiconductor device, a recording medium, and a substrate processing apparatus.

BACKGROUND

In the related art, as a process of processing a substrate (a process of manufacturing a semiconductor device), a plurality of substrates may be processed.

SUMMARY

Some embodiments of the present disclosure provide a technique capable of controlling a processing amount for a substrate such that a distribution of the processing amount becomes a desired distribution among a plurality of substrates.

According to some embodiments of the present disclosure, there is provided a technique that includes: (a) arranging a plurality of first substrates, each including a surface on which a concave structure is formed, in multiple stages in a first region along a direction perpendicular to the surface; (b) supplying a first processing gas toward at least a portion of the first region; and (c) supplying an inert gas different from the first processing gas toward the at least a portion of the first region, wherein the first region includes a first zone including one end of the first region, a third zone including the other end of the first region, and a second zone located between the first zone and the third zone, and wherein in (c), the inert gas is supplied toward the second zone and is supplied toward at least one selected from the group of the first zone and the third zone at a flow rate smaller than a flow rate of the inert gas supplied toward the second zone, or the inert gas is supplied toward the second zone and is not supplied toward the first zone and the third zone.

BRIEF DESCRIPTION OF DRAWINGS

The accompanying drawings, which are incorporated in and constitute a part of the present disclosure, illustrate embodiments of the present disclosure.

DETAILED DESCRIPTION

Figure 1:
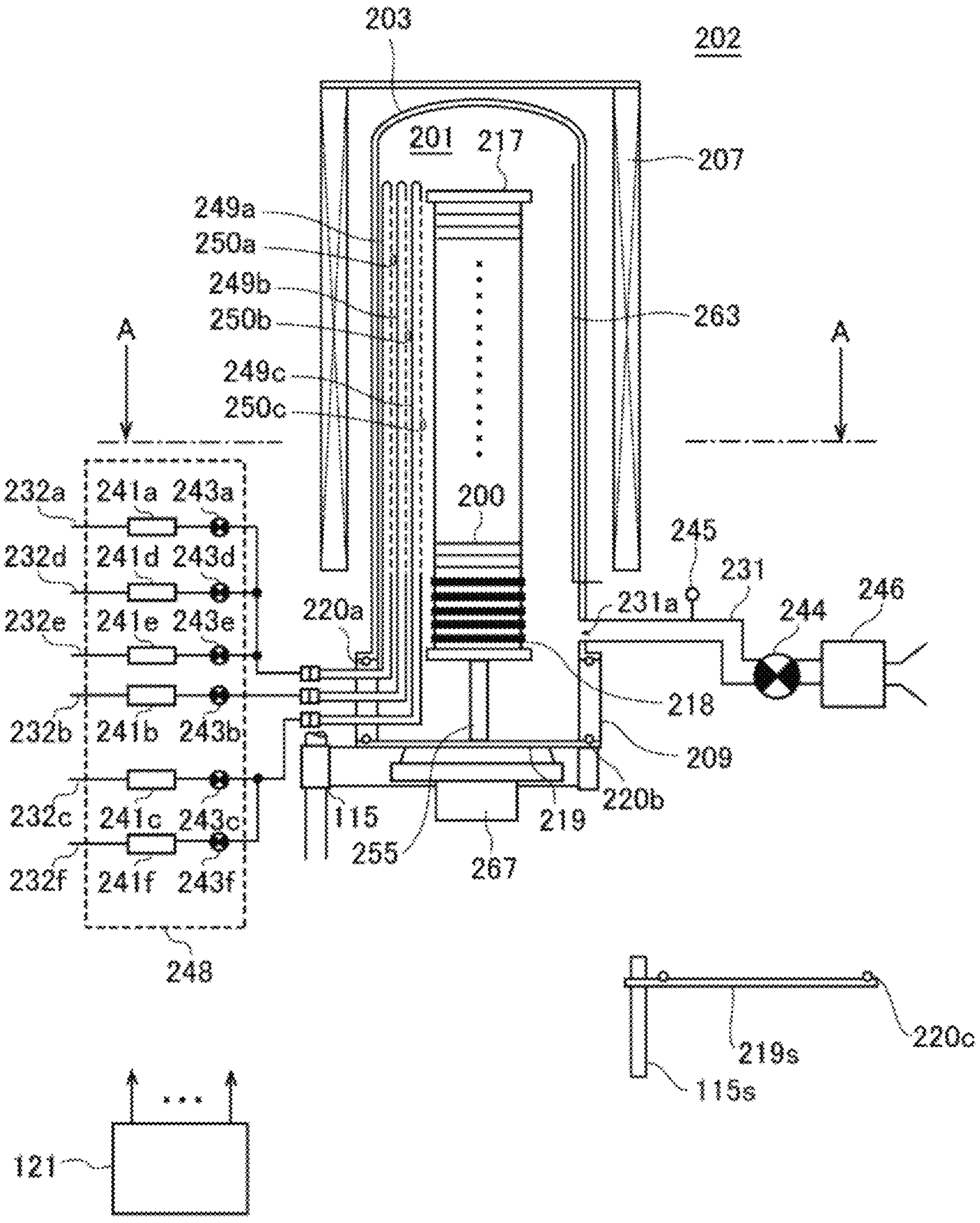
FIG. 1 is a schematic configuration diagram of a vertical process furnace of a substrate processing apparatus suitably used in some embodiments of the present disclosure, in which a portion of the process furnace is illustrated in a vertical cross-sectional view.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components are not described in detail so as not to obscure aspects of the various embodiments.

EMBODIMENTS OF THE PRESENT DISCLOSURE

Hereinafter, some embodiments of the present disclosure will be described mainly with reference to FIGS. 1 to 6. The drawings used in the following description are schematic, and dimensional relationships, ratios, and the like of various components shown in the drawings may not match actual ones. Further, dimensional relationships, ratios, and the like of various components among plural drawings may not match one another.

(1) Configuration of Substrate Processing Apparatus

As shown in FIG. 1, a process furnace 202 includes a heater 207 as a temperature regulator (heating part). The heater 207 is formed in a cylindrical shape and is vertically installed by being supported by a holding plate. The heater 207 functions as an activator (an exciter) configured to thermally activate (excite) a gas.

A reaction tube 203 is disposed inside the heater 207 to be concentric with the heater 207. The reaction tube 203 is constituted by, for example, a heat-resistant material such as quartz ($SiO_2$) or silicon carbide (SiC), and is formed in a cylindrical shape with its upper end closed and lower end opened. A manifold 209 is disposed under the reaction tube 203 to be concentric with the reaction tube 203. An upper end of the manifold 209 is configured to engage with the lower end of the reaction tube 203 to support the reaction tube 203. An O-ring 220*a* serving as a seal is installed between the manifold 209 and the reaction tube 203. Similar to the heater 207, the reaction tube 203 is vertically installed. A process container (reaction container) mainly includes the reaction tube 203 and the manifold 209. A process chamber 201 in which wafers 200 as substrates are processed is formed in a hollow cylindrical area of the process container. The process chamber 201 is configured to be capable of accommodating the wafers 200 in such a state that the wafers 200 are arranged from one end side (a lower side) to the other end side (an upper side) in the process chamber 201. A region in the process chamber 201 where the wafers 200 are arranged is also referred to as a substrate arrangement region (a wafer arrangement region). Further, a direction in which the wafers 200 are arranged in the process chamber 201 is also referred to as a substrate arrangement direction (a wafer arrangement direction). The wafers 200 include product wafers 200*a* as first substrates and dummy wafers 200*b* as second substrates.

Nozzles 249*a* to 249*c* as first to third suppliers are respectively installed in the process chamber 201 so as to penetrate a side wall of the manifold 209. The nozzles 249*a* to 249*c* are also referred to as first to third nozzles, respectively. The nozzles 249*a* to 249*c* are made of, for example, a heat-resistant material such as quartz or SiC. Gas supply pipes 232*a* to 232*c* are connected to the nozzles 249*a* to 249*c* respectively. The nozzles 249*a* to 249*c* are different nozzles, and each of the nozzles 249*a* and 249*c* is installed adjacent to the nozzle 249*b*.

At the gas supply pipes 232*a* to 232*c*, mass flow controllers (MFCs) 241*a* to 241*c*, which are flow rate controllers (flow rate control parts), and valves 243*a* to 243*c*, which are opening/closing valves, are respectively installed sequentially from an upstream side of a gas flow. Gas supply pipes 232*d* and 232*e* are connected to the gas supply pipe 232*a* at a downstream side of the valve 243*a*. A gas supply pipe 232*f* is connected to the gas supply pipe 232*c* at a downstream side of the valve 243*c*. At the gas supply pipes 232*d* to 232*f*, MFCs 241*d* to 241*f* and valves 243*d* to 243*f* are respectively installed sequentially from an upstream side of a gas flow.

Figure 2:
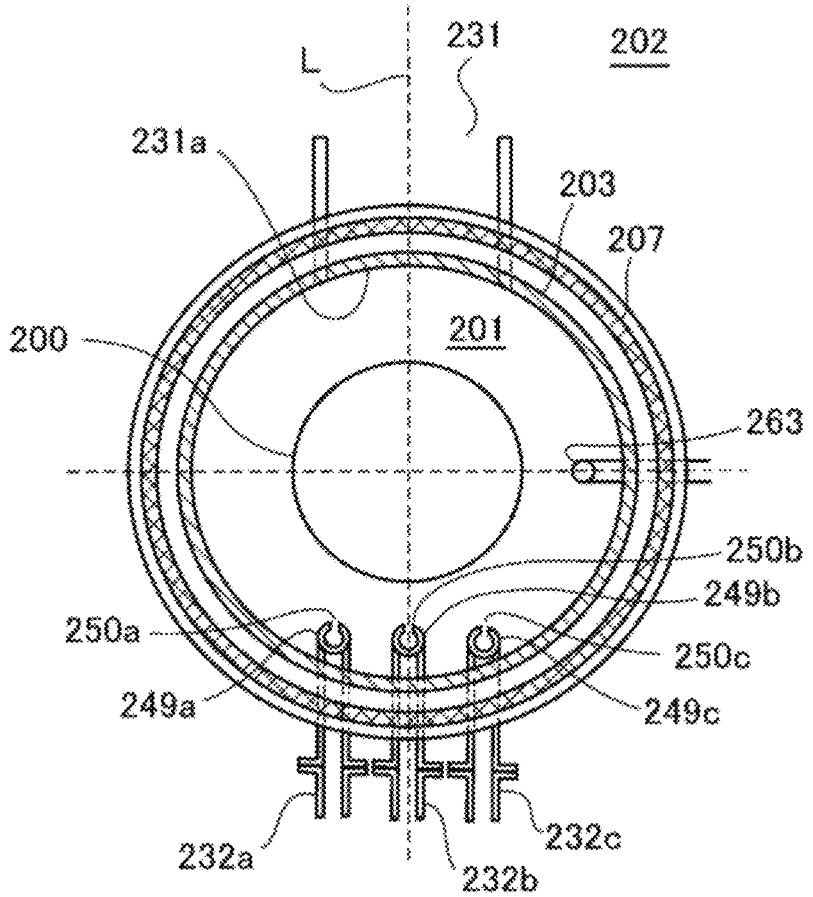
FIG. 2 is a schematic configuration diagram of a vertical process furnace of a substrate processing apparatus suitably used in some embodiments of the present disclosure, in which the portion of the process furnace is illustrated in a cross-sectional view taken along line A-A in FIG. 1.

As shown in FIG. 2, the nozzles 249*a* to 249*c* are respectively installed in an annular space (in a plane view) between an inner wall of the reaction tube 203 and the wafers 200 so as to extend upward from a lower side to an upper side of the inner wall of the reaction tube 203, that is, along an arrangement direction of wafers 200. In other words, the nozzles 249*a* to 249*c* are respectively installed in a region horizontally surrounding a wafer arrangement region at a lateral side of the wafer arrangement region, along the wafer arrangement region. In the plane view, the nozzle 249*b* is disposed to face an exhaust port 231*a* to be described below in a straight line with centers of the wafers 200, which are loaded into the process chamber 201, interposed therebetween. In the present disclosure, the nozzles 249*a*, 249*b*, and 249*c* are also referred to as R1, R2, and R3, respectively.

A plurality of gas supply holes 250*a* to 250*c* configured to supply a gas are formed at side surfaces of the nozzles 249*a* to 249*c*, respectively. Each of the gas supply holes 250*a* to 250*c* is opened to face (oppose) the exhaust port 231*a* in the plane view, and is configured to be capable of supplying the gas toward the wafers 200.

Figure 5:
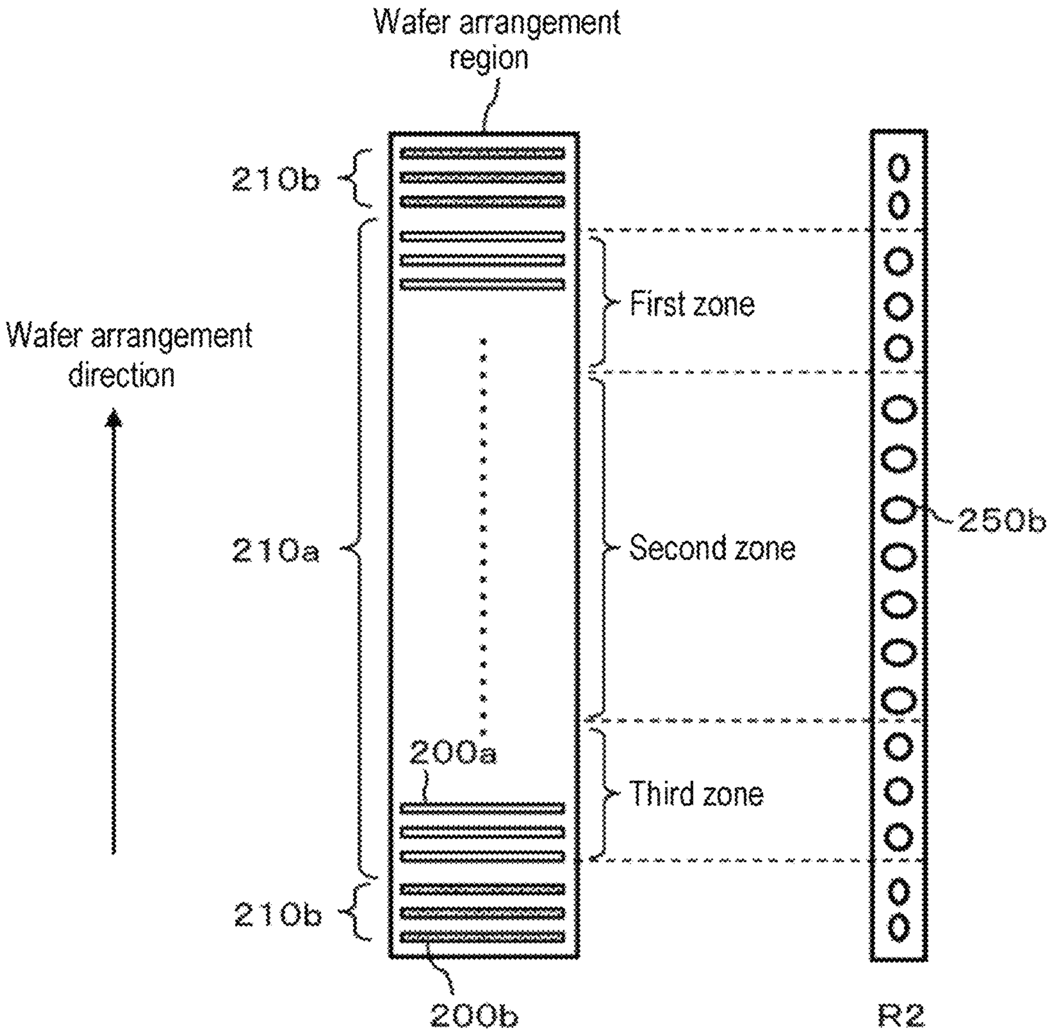
FIG. 5 is a schematic configuration diagram of a second nozzle suitably used in some embodiments of the present disclosure.

As shown in FIG. 5, the wafer arrangement region may be considered to be divided into a plurality of regions. In the embodiments of the present disclosure, a center side of the wafer arrangement region in the wafer arrangement direction (a direction perpendicular to a surface of the wafer 200) is also referred to as a first region 210*a*. Both ends of the wafer arrangement region in the wafer arrangement direction are also referred to as second regions 210*b*. The product wafers 200*a* are arranged in the first region 210*a*, and the dummy wafers 200*b* are arranged in the second regions 210*b*. The first region 210*a* may be considered to be divided into a plurality of zones. In the embodiments of the present disclosure, a zone on one end side (herein, an upper side) of the first region 210*a* in the wafer arrangement direction is also referred to as a first zone. Further, a zone on a center side of the first region 210*a* in the wafer arrangement direction is also referred to as a second zone. Further, a zone on the other end side (herein, a lower side) of the first region 210*a* in the wafer arrangement direction is also referred to as a third zone. The first zone is located adjacent to the second region 210*b* on one end side (herein, the upper side), and the third zone is located adjacent to the second region 210*b* on the other end side (herein, the lower side).

The gas supply holes 250*a* and 250*c* as openings in the nozzles 249*a* and 249*c* are formed at a plurality of portions (positions) facing the first region 210*a* and the second regions 210*b* over regions from upper sides to lower sides of the nozzles 249*a* and 249*c*, respectively. That is, the nozzles 249*a* and 249*c* are configured to supply a gas toward the first region 210*a* and the second regions 210*b*, respectively. The gas supply holes 250*a* and 250*c* are formed in the same shape (e.g., a circular shape), formed with the same opening area, and formed at equal intervals (pitches), respectively. However, in the present disclosure, the gas supply holes 250*a* and 250*c* may be formed in shapes which are not particularly limited to the above-described embodiments, and may be constituted by, for example, one or more slit-like openings formed along extension directions of the nozzles 249*a* and 249*c*.

A plurality of gas supply holes 250*b* as openings in the nozzle 249*b* are formed, for example, at portions (positions) facing the first region 210*a* (first to third zones) and the second regions 210*b* over a region from an upper side to a lower side of the nozzle 249*b*. That is, the nozzle 249*b* is configured to supply a gas toward the first region 210*a* and the second regions 210*b*.

As shown in FIG. 5, the gas supply holes 250*b* are formed, for example, in a circular or elliptical shape, and are constituted such that opening areas thereof varies depending on arrangement (disposition) positions. Specifically, the opening areas of the gas supply holes 250*b* per unit length in the direction perpendicular to the surface of the wafer 200 are set to be larger at the portion facing the second zone than at the portions facing the first zone and the third zone. The opening areas of the gas supply holes 250*b* per unit length in the direction perpendicular to the surface of the wafer 200 are set to be larger at the portions facing the first zone and the third zone than at the portions facing the second regions 210*b*. The opening areas of the gas supply holes 250*b* per unit length in the direction perpendicular to the surface of the wafer 200 are set to be larger at the portion facing the second zone than at the portions facing the second regions 210*b*. It is possible to regulate a gas discharge flow rate per unit length in the direction perpendicular to the surface of the wafer 200 at a pertinent position by adjusting the opening areas of the gas supply holes 250*b* per unit length in the direction perpendicular to the surface of the wafer 200. A flow rate of the inert gas per unit length of the nozzle 249*b* (the opening areas of the gas supply holes 250*b* per unit length) may be regulated by the opening areas of the gas supply holes 250*b* and the number (pitches) of the gas supply holes 250*b* per unit length of the nozzle 249*b*.

A first processing gas is supplied from the gas supply pipe 232*a* into the process chamber 201 via the MFC 241*a*, the valve 243*a*, and the nozzle 249*a*. In the present disclosure, the nozzle 249*a* (a first nozzle, R1) configured to supply the first processing gas is also referred to as a first processing gas nozzle.

An inert gas is supplied from the gas supply pipe 232*b* into the process chamber 201 via the MFC 241*b*, the valve 243*b*, and the nozzle 249*b*. In the present disclosure, the nozzle 249*b* (a second nozzle, R2) configured to supply the inert gas is also referred to as an inert gas nozzle. The inert gas supplied via the nozzle 249*b* mainly acts as a dilution gas. The inert gas supplied via the nozzle 249*b* may also act as a purge gas. Hereinafter, the inert gas supplied from the nozzle 249*b* may be referred to as a dilution inert gas.

A second processing gas is supplied from the gas supply pipe 232*c* into the process chamber 201 via the MFC 241*c*, the valve 243*c*, and the nozzle 249*c*. In the present disclosure, the nozzle 249*c* (a third nozzle, R3) configured to supply the second processing gas is also referred to as a second processing gas nozzle.

A catalyst is supplied from the gas supply pipe 232*d* into the process chamber 201 via the MFC 241*d*, the valve 243*d*, and the nozzle 249*a* (a first nozzle, R1).

An inert gas is supplied from the gas supply pipes 232*e* and 232*f* into the process chamber 201 via the MFCs 241*e* and 241*f*, the valves 243*e* and 243*f*, the gas supply pipes 232*a* and 232*c*, and the nozzles 249*a* and 249*c*, respectively. The inert gas supplied via the nozzles 249*a* and 249*c* acts as a purge gas, a carrier gas, etc.

A first processing gas supplier mainly includes the gas supply pipe 232*a*, the MFC 241*a*, and the valve 243*a*. An inert gas supplier (which may be also referred to as an inert gas supply system or a dilution inert gas supplier) mainly includes the gas supply pipe 232*b*, the MFC 241*b*, and the valve 243*b*. A second processing gas supplier (a second processing gas supply system) mainly includes the gas supply pipe 232*c*, the MFC 241*c*, and the valve 243*c*. A catalyst supplier (a catalyst supply system) mainly includes the gas supply pipe 232*d*, the MFC 241*d*, and the valve 243*d*. A second inert gas supplier (a second inert gas supply system) mainly includes the gas supply pipes 232*e* and 232*f*, the MFCs 241*e* and 241*f*, and the valves 243*e* and 243*f*. The nozzles connected to the gas supply pipes constituting the various suppliers described above may be included in the suppliers respectively.

One or the entirety of the various suppliers described above may be constituted as an integrated supply system 248 in which the valves 243*a* to 243*f*, the MFCs 241*a* to 241*f*, and the like are integrated.

An exhaust port 231*a* configured to exhaust an internal atmosphere of the process chamber 201 is installed at the lower side of a side wall of the reaction tube 203. As shown in FIG. 2, the exhaust port 231*a* is installed at a position facing (opposing) the nozzles 249*a* to 249*c* (the gas supply holes 250*a* to 250*c*) with the wafers 200 interposed therebetween in a plane view. The exhaust port 231*a* may be installed to extend from the lower side to the upper side of the side wall of the reaction tube 203, that is, along the wafer arrangement region. An exhaust pipe 231 is connected to the exhaust port 231*a*. A vacuum pump 246 as a vacuum exhauster is connected to the exhaust pipe 231 via a pressure sensor 245, which is a pressure detector (a pressure detection part) configured to detect an internal pressure of the process chamber 201, and an auto pressure controller (APC) valve 244, which is a pressure regulator (a pressure regulation part). The APC valve 244 is configured to be capable of performing or stopping a vacuum exhaust of an inside of the process chamber 201 by being opened or closed while the vacuum pump 246 is actuated, and is also configured to be capable of regulating the internal pressure of the process chamber 201 by adjusting a degree of valve opening based on the pressure information detected by the pressure sensor 245 while the vacuum pump 246 is actuated. An exhaust system mainly includes the exhaust pipe 231, the APC valve 244, and the pressure sensor 245. The vacuum pump 246 may be included in the exhaust system.

A seal cap 219 as a furnace opening lid configured to be capable of airtightly closing a lower end opening of the manifold 209 is installed below the manifold 209. An O-ring 220*b* as a seal, which comes into contact with the lower end of the manifold 209, is installed on an upper surface of the seal cap 219. A rotator 267 configured to rotate a boat 217 to be described later is installed below the seal cap 219. A rotary shaft 255 of the rotator 267 is connected to the boat 217 through the seal cap 219. The rotator 267 is configured to rotate the wafers 200 by rotating the boat 217. The seal cap 219 is configured to be vertically raised or lowered by a boat elevator 115 which is an elevator installed outside the reaction tube 203. The boat elevator 115 is constituted as a transfer apparatus (transfer mechanism) configured to load or unload (transfer) the wafers 200 into or out of the process chamber 201 by raising or lowering the seal cap 219.

Below the manifold 209, a shutter 219*s* is installed as a furnace opening lid configured to be capable of airtightly closing the lower end opening of the manifold 209 while the seal cap 219 is lowered and the boat 217 is unloaded from the process chamber 201. An O-ring 220*c* as a seal, which comes into contact with the lower end of the manifold 209, is installed on an upper surface of the shutter 219*s*. The opening/closing operation (such as an elevating operation, a rotating operation, or the like) of the shutter 219*s* is controlled by a shutter opening/closing mechanism 115*s*.

A boat 217 serving as a substrate support is configured to support a plurality of wafers 200, for example, 25 to 200 wafers 200 in such a state that the wafers 200 are arranged in a horizontal posture and in multiple stages along a vertical direction with centers of the wafers 200 aligned with one another. That is, the boat 217 is configured to arrange the wafers 200 to be spaced apart from each other. Heat insulating plates 218 are supported in multiple stages at a lower side of the boat 217.

A temperature sensor 263 serving as a temperature detector is installed in the reaction tube 203. Based on temperature information detected by the temperature sensor 263, a state of supplying electric power to the heater 207 is regulated such that a temperature distribution in the process chamber 201 becomes a desired temperature distribution. The temperature sensor 263 is installed along the inner wall of the reaction tube 203.

Figure 3:
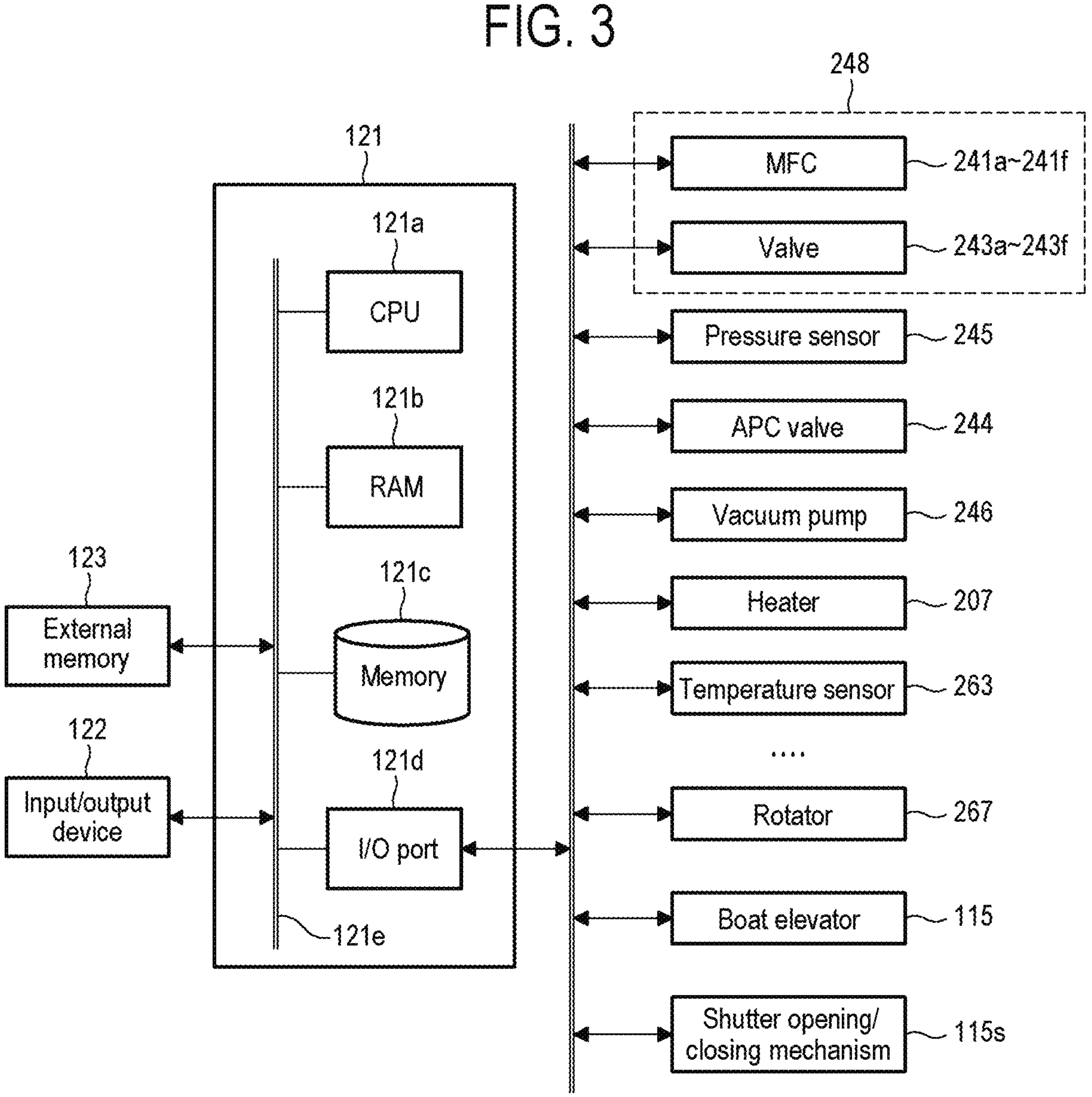
FIG. 3 is a schematic configuration diagram of a controller of a substrate processing apparatus suitably used in some embodiments of the present disclosure, in which a control system of the controller is illustrated in a block diagram.

As shown in FIG. 3, the controller 121 as a control part (control means or unit) is constituted as a computer including a central processing unit (CPU) 121*a*, a random access memory (RAM) 121*b*, a memory 121*c* and an I/O port 121*d*. The RAM 121*b*, the memory 121*c*, and the I/O port 121*d* are configured to be capable of exchanging data with the CPU 121*a* via an internal bus 121*e*. An input/output device 122 constituted as, for example, a touch panel or the like is connected to the controller 121. Further, an external memory 123 may be connected to the controller 121. The substrate processing apparatus may be configured to include one controller or a plurality of controller. That is, a control to perform a processing sequence to be described later may be performed by using one controller or a plurality of controllers. Further, the plurality of controllers may be constituted as a control system in which the controllers are connected to one another via a wired or wireless communication network, and the control to perform the processing sequence to be described later may be performed by the entire control system. When the term "controller" is used in the present disclosure, it may include one controller, a plurality of controllers, or a control system constituted by a plurality of controllers.

The memory 121*c* is constituted by, for example, a flash memory, a hard disk drive (HDD), a solid state drive (SSD), or the like. A control program that controls an operation of a substrate processing apparatus, a process recipe in which procedures and conditions of substrate processing to be described later are written, and the like are readably recorded and stored in the memory 121*c*. The process recipe functions as a program that is combined to cause, by the controller 121, the substrate processing apparatus to perform each procedure in a substrate processing to be described later so as to obtain a predetermined result. Hereinafter, the process recipe, the control program, and the like are generally and simply referred to as a program. Further, the process recipe may be also simply referred to as a recipe. When the term "program" is used herein, it may mean a case of including the recipe, a case of including the control program, or a case of including both the recipe and the control program. The RAM 121*b* is constituted as a memory area (work area) in which programs, data, and the like read by the CPU 121*a* are temporarily held.

The I/O port 121*d* is connected to the MFCs 241*a* to 241*f*, the valves 243*a* to 243*f*, the pressure sensor 245, the APC valve 244, the vacuum pump 246, the temperature sensor 263, the heater 207, the rotator 267, the boat elevator 115, the shutter opening/closing mechanism 115*s*, and the like.

The CPU 121*a* is configured to be capable of reading and executing the control program from the memory 121*c* and reading the recipe from the memory 121*c* according to an input of an operation command from the input/output device 122 or the like. The CPU 121*a* is configured to be capable of controlling flow rate regulating operations of various materials (various gases) by the MFCs 241*a* to 241*f*, opening/closing operations of the valves 243*a* to 243*f*, an opening/closing operation of the APC valve 244, a pressure regulating operation performed by the APC valve 244 based on the pressure sensor 245, an operation of actuating or stopping the vacuum pump 246, a temperature regulating operation performed by the heater 207 based on the temperature sensor 263, operations of rotating the boat 217 and adjusting a rotation speed of the boat 217 with the rotator 267, an operation of raising or lowering the boat 217 by the boat elevator 115, an opening/closing operation of the shutter 219*s* by the shutter opening/closing mechanism 115*s*, and the like, according to contents of the read recipe.

The controller 121 may be constituted by installing, in the computer, the above-described program recorded and stored in an external memory 123. Examples of the external memory 123 may include a magnetic disc such as a HDD, an optical disc such as a CD, a magneto-optical disc such as a MO, a semiconductor memory such as a USB memory or a SSD, and the like. The memory 121*c* or the external memory 123 is constituted as a computer-readable recording medium. Hereinafter, the memory 121*c* and the external memory 123 may be generally and simply referred to as a recording medium. As used herein, the term "recording medium" may include the memory 121*c*, the external memory 123, or both. Further, the program may be provided to the computer by using communication means or unit such as the Internet or a dedicated line, instead of using the external memory 123.

(2) Substrate Processing Process

Figure 4:
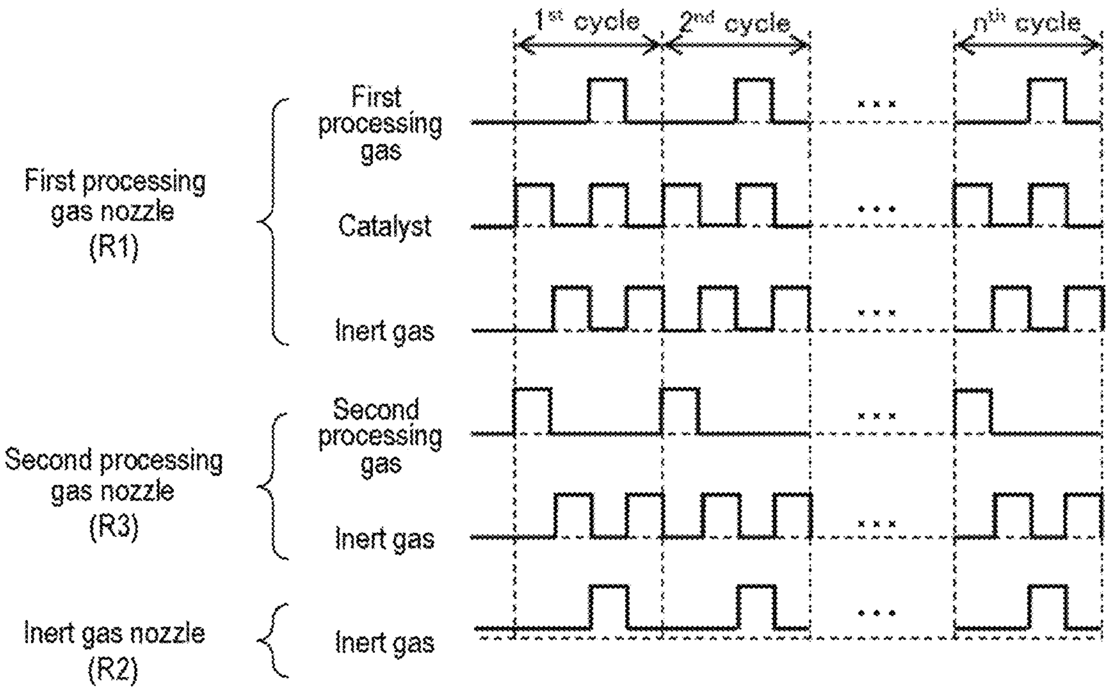
FIG. 4 is a diagram showing a processing sequence in some embodiments of the present disclosure.

An example of a sequence to perform a method of processing a substrate, i.e., a processing sequence to form a film on a wafer 200 as a substrate with a three-dimensional concave structure such as a trench or a groove and a hole formed on its surface, will be described as a process of manufacturing a semiconductor device by using the above-described substrate processing apparatus, mainly with reference to FIG. 4. In the following description, an operation of each component of the substrate processing apparatus is controlled by the controller 121.

A processing sequence according to the embodiments of the present disclosure includes:

(a) step A of arranging a plurality of product wafers 200*a* as first substrates, each including a surface on which a concave structure is formed, in multiple stages in a first region 210*a* along a direction perpendicular to the surface;

(b) step B of supplying a first processing gas toward at least a portion of the first region 210*a*; and (c) step C of supplying an inert gas different from the first processing gas toward at least a portion of the first region 210*a*, wherein the first region 210*a* includes a first zone including one end of the first region 210*a*, a third zone including the other end of the first region 210*a*, and a second zone located between the first zone and the third zone, and wherein in step C, the inert gas is supplied toward the second zone and is supplied toward at least one selected from the group of the first zone and the third zone at a flow rate smaller than a flow rate of the inert gas supplied toward the second zone, or the inert gas is supplied toward the second zone and is not supplied toward the first zone and the third zone.

In the embodiments, a case will be described in which the above-described step A includes a process of arranging dummy wafers 200*b*, which serve as second substrates with surface areas smaller than surface areas of the product wafer 200*a*, in the second region 210*b* different from the first region 210*a*. As the dummy wafer 200*b*, a bare wafer with no pattern formed on a surface thereof may be used, or a wafer with a pattern formed on a surface thereof may be used. Even in a case where the wafer with a pattern formed on a surface thereof is used as the dummy wafer 200*b*, the surface area of the dummy wafer 200*b* is smaller than the surface area of the product wafer 200*a*. The product wafer 200*a* and the dummy wafer 200*b* may be generally referred to as wafers 200.

In the embodiments of the present disclosure, a case will be described in which the processing sequence further includes:

(d) step D of supplying a second processing gas, which contains a predetermined element and is different from the first processing gas, toward the first region 210*a*, wherein a cycle including steps B, C, and D is performed a predetermined number of times (n times where n is an integer of 1 or 2 or more) to form a film containing the predetermined element on each of the plurality of product wafers 200*a*.

In the embodiments of the present disclosure, a case will be described in which the second processing gas containing the predetermined element is used as a precursor gas, and the first processing gas is used as a reaction gas.

In the embodiments of the present disclosure, in step B, the first processing gas (reaction gas) is supplied from the nozzle 249*a* (R1, a first processing gas nozzle). In step C, the inert gas is supplied from the nozzle 249*b* (R2, an inert gas nozzle). In step D, the second processing gas (precursor gas) is supplied from the nozzle 249*c* (R3, a second processing gas nozzle).

In the embodiments of the present disclosure, a case will be described in which a catalyst is simultaneously supplied when the first processing gas and the second processing gas are supplied in steps B and D, respectively.

In the embodiments of the present disclosure, a case will be described in which the inert gas is supplied to the first to third zones in step C.

In the embodiments of the present disclosure, for the sake of convenience, the above-described processing sequence may be expressed as follows. Similar notations will be used in the following descriptions of modifications and other embodiments.

{(R3: second processing gas)+(R1: catalyst)→(R1: first processing gas)+(R1: catalyst)+(R2: inert gas)}×n The term "wafer" used herein may refer to a wafer itself or a stacked body of a wafer and a predetermined layer or film formed on the surface of the wafer. The phrase "a surface of a wafer" used herein may refer to a surface of a wafer itself or a surface of a predetermined layer or the like formed on a wafer. The expression "a predetermined layer is formed on a wafer" used herein may mean that a predetermined layer is directly formed on a surface of a wafer itself or that a predetermined layer is formed on a layer or the like formed on a wafer. The term "substrate" used herein may be synonymous with the term "wafer."

As used herein, the term "layer" includes at least one selected from the group of a continuous layer and a discontinuous layer. For example, a first layer or a second layer to be described later may include a continuous layer, a discontinuous layer, or both of them.

In the present disclosure, when a case is described in which the first processing gas and the second processing gas are respectively adsorbed on or react with the surface of the wafer 200, it may include an aspect where the first processing gas and the second processing gas are adsorbed on or react with the surface of the wafer while being undecomposed, and an aspect where intermediates generated by the decomposition of the first processing gas and the second processing gas or by desorption of ligands thereof are adsorbed on or react with the surface of the wafer 200.

(Wafer Charging and Boat Loading)

After the boat 217 is charged with a plurality of wafers 200 (product wafers 200*a* and dummy wafers 200*b*) (wafer charging), the shutter 219*s* is moved by the shutter opening/closing mechanism 115*s* to open the lower end opening of the manifold 209 (shutter opening). When the boat 217 is charged with the wafers 200, an upper end side and a lower end side of the boat 217 are charged with the dummy wafers 200*b*, and a center side interposed between the upper end side and the lower end side of the boat 217 is charged with the product wafers 200*a*. Then, as shown in FIG. 1, the boat 217 supporting the plurality of wafers 200 is lifted by the boat elevator 115 and loaded into the process chamber 201 (boat loading). In such a state, the seal cap 219 seals the lower end of the manifold 209 via the O-ring 220*b*. In this manner, the product wafers 200*a* are arranged in multiple stages in the first region 210*a* along a direction perpendicular to the surfaces of the product wafers 200*a*, and the dummy wafers 200*b* are arranged in the second regions 210*b* (step A). The dummy wafers 200*b* are not arranged in the first region 210*a*. In a case where an empty slot exists in a portion of the first region 210*a*, the dummy wafers 200*b* may be arranged (filled) in the empty slot. However, even in such a case, the number of dummy wafers 200*b* arranged in the first region 210*a* is sufficiently smaller (e.g., 1/10 or less) than the number of product wafers 200*a*.

(Pressure Regulation and Temperature Regulation)

After the boat loading is completed, the inside of the process chamber 201, that is, a space where the wafers 200 are placed, i.e., a processing space, is vacuum-exhausted (decompression-exhausted) by the vacuum pump 246 to reach a desired pressure (degree of vacuum). In this operation, the internal pressure of the process chamber 201 is measured by the pressure sensor 245, and the APC valve 244 is feedback-controlled based on the measured pressure information (pressure regulation). Further, the wafers 200 in the process chamber 201 are heated by the heater 207 to reach a desired processing temperature. At this time, a state of supplying an electric power to the heater 207 is feedback-controlled based on the temperature information detected by the temperature sensor 263 such that a temperature distribution in the process chamber 201 becomes a desired temperature distribution (temperature regulation). Further, the rotation of the wafer 200 by the rotator 267 is started. The exhaust of the inside of the process chamber 201 and the heating and rotation of the wafers 200 may be continuously performed at least until the processing on the wafers 200 is completed.

(Film Formation Process)

Then, steps B, C, and D are performed in the following order.

[Step D]

In this step, a second processing gas containing a predetermined element and a catalyst are supplied toward the first region 210*a* and the second region 210*b* in the process chamber 201.

Specifically, the valves 243*c* and 243*d* are opened to allow the second processing gas to flow through the gas supply pipe 232*c* and allow the catalyst to flow through the gas supply pipe 232*d*. Flow rates of the second processing gas and the catalyst are regulated by the MFCs 241*c* and 241*d*, respectively. The second processing gas and the catalyst are supplied into the process chamber 201 via the nozzles 249*c* and 249*a*, and are mixed after being supplied into the process chamber 201 and exhausted via the exhaust port 231*a*. At this time, the second processing gas and the catalyst are supplied to the wafers 200 (supply of second processing gas+catalyst). At this time, the valves 243*e* and 243*f* may be opened to supply an inert gas into the process chamber 201 via the nozzles 249*a* (R1) and 249*c* (R3) respectively.

At this time, the valve 243*b* is opened to allow the inert gas to flow through the gas supply pipe 232*b*. A flow rate of the inert gas is regulated by the MFC 241*b*. The inert gas is supplied into the process chamber 201 via the nozzle 249*b* (R2), and is exhausted via the exhaust port 231*a*.

Processing conditions in this step are exemplified as follows:

Supply flow rate of second processing gas: 1 to 2,000 sccm

Supply flow rate of catalyst: 1 to 2,000 sccm

Supply flow rate of inert gas (R2): 1 to 1,000 sccm

Supply flow rate of inert gas (for each of R1 and R3): 0 to 20,000 sccm

Supply time of each gas: 1 to 100 seconds, specifically 5 to 60 seconds

Processing temperature: room temperature (25 degrees C.) to 200 degrees C., specifically room temperature to 150 degrees C.

Processing pressure: 133 to 1,333 Pa.

However, the flow rate of the inert gas supplied from R2 may be smaller than the flow rate of the inert gas supplied from R2 in step B described below.

In the present disclosure, notation of a numerical range such as "25 to 120 degrees C." means that a lower limit and an upper limit are included in that range. Therefore, for example, "25 to 120 degrees C." means "25 degrees C. or more and 120 degrees C. or less." The same applies to other numerical ranges. Further, in the present disclosure, a processing temperature means a temperature of the wafer 200 or an internal temperature of the process chamber 201, and a processing pressure means an internal pressure of the process chamber 201, in other words, a pressure in a space where the wafer 20 exists. Further, a processing time means a time during which the processing is continued. Further, when 0 sccm is included in the supply flow rate, 0 sccm means a case where no substance (gas) is supplied. The same applies to the following description.

Under the above-described processing conditions, by supplying a second processing gas containing a predetermined element (i.e., a precursor gas containing a predetermined element) toward the first region 210*a* and the second region 210*b*, the second processing gas may be adsorbed on the surface of the wafer 200 (an upper surface and an inner surface of the concave structure) to form a first layer containing the predetermined element.

In this step, by supplying the catalyst together with the second processing gas, it becomes possible to allow the above-described reaction (particularly, adsorption) to proceed under the above-described low temperature condition.

Figure 6:
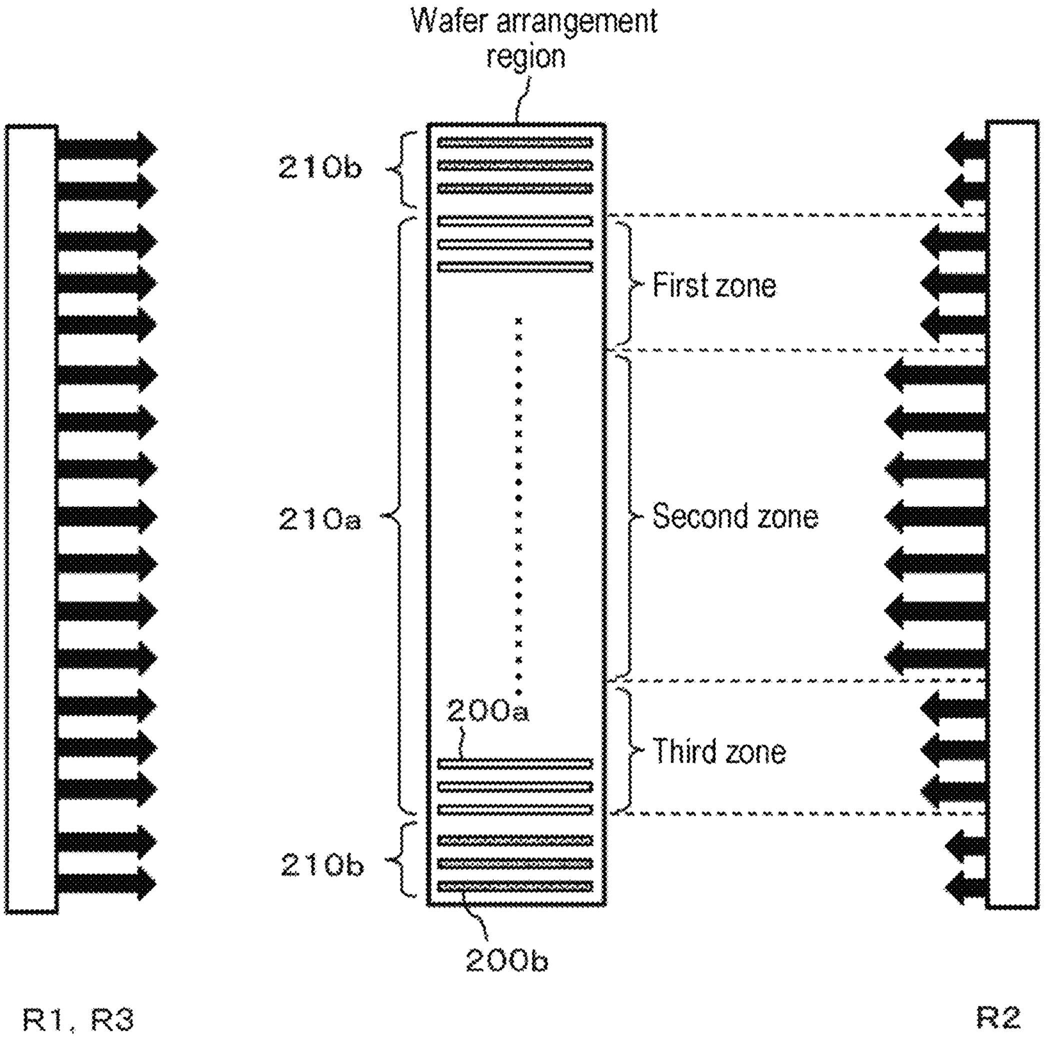
FIG. 6 is a diagram showing a flow rate distribution of an inert gas supplied from a second nozzle suitably used in some embodiments of the present disclosure, and a flow rate distribution of a gas supplied from a first nozzle and a third nozzle.

According to the configuration of the gas supply holes 250*a* and 250*c* described above, in this step, the second processing gas and the catalyst are respectively supplied at the same flow rate toward both the first region 210*a* and the second region 210*b* (see FIG. 6).

Further, according to the configuration of the gas supply holes 250*b* described above, the inert gas supplied from the nozzle 249*b* (R2) is supplied toward the first region 210*a* and the second region 210*b* with the flow rate distribution shown in FIG. 6. A flow rate distribution of the inert gas supplied (discharged) from the nozzle 249*b* (R2) will be described later in detail. The flow rate distribution of the inert gas supplied from the nozzle 249*b* (R2) in this step may be different from the flow rate distribution of the inert gas supplied from the nozzle 249*b* (R2) in steps B and C to be described later.

In a case where the predetermined element is silicon (Si), the second processing gas may be a silane-based gas. As the silane-based gas, for example, a gas containing Si and a halogen, i.e., a halosilane-based gas, may be used. As the halogen, at least one element selected from the group of chlorine (Cl), fluorine (F), bromine (Br), and iodine (I) may be used. As the halosilane-based gas, for example, a chlorosilane-based gas containing Si and Cl may be used.

As the second processing gas, for example, a chlorosilane-based gas such as a monochlorosilane ($SiH_3Cl$) gas, a dichlorosilane ($SiH_2Cl_2$) gas, a trichlorosilane ($SiHCl_3$) gas, a tetrachlorosilane ($SiCl_4$) gas, a hexachlorodisilane ($Si_2Cl_6$) gas, an octachlorotrisilane ($Si_3Cl_3$) gas, a hexachlorodisiloxane ($Cl_3Si—O—SiCl_3$) gas, an octachlorotrisiloxane ($Cl_3Si—O—SiCl_2—O—SiCl_3$) gas, a 1,1,3,3-tetrachloro-1,3-disilacyclobutane ($C_2H_4Cl_4Si_2$) gas, a bis(trichlorosilyl) methane ($(SiCl_3)_2CH_2$) gas, a 1,2-bis(trichlorosilyl)ethane ($(SiCl_3)_2C_2H_4$) gas, a 1,1,2,2-tetrachloro-1,2-dimethyldisilane ($(CH_3)_2Si_2Cl_4$) gas, a 1,2-dichloro-1,1,2,2-tetramethyldisilane ($(CH_3)_4Si_2Cl_2$) gas, or the like may be used.

As the second processing gas, in addition to the chlorosilane-based gas, for example, a fluorosilane-based gas, a bromosilane-based gas, or an iodosilane-based gas may also be used.

As the second processing gas, in addition to these gases, for example, an aminosilane-based gas, i.e., a gas containing Si and an amino group, such as a tetrakis(dimethylamino) silane ($Si[N(CH_3)_2]_4$) gas, a tris(dimethylamino)silane ($Si[N(CH_3)_2]_3H$) gas, a bis(diethylamino)silane ($Si[N(C_2H_5)_2]_2H_2$) gas, a bis(tertiary-butylamino)silane ($SiH_2[NH(C_4H_9)]_2$) gas, a (diisopropylamino)silane ($SiH_3[N(C_3H_7)_2]$) gas, or the like may also be used.

As the second processing gas, one or more of these gases may be used.

As the catalyst, for example, an amine-based gas (amine-based substance) containing carbon (C), nitrogen (N), and hydrogen (H) may be used. As the amine-based gas, a cyclic amine-based gas (cyclic amine-based substance) or a chain amine-based gas (chain amine-based substance) may be used. As the catalyst, for example, a cyclic amine such as pyridine ($C_5H_5N$), aminopyridine ($C_5H_6N_2$), picoline ($C_6H_7N$), lutidine ($C_7H_9N$), pyrimidine ($C_4H_4N_2$), quinoline ($C_9H_7N$), piperazine ($C_4H_{10}N_2$), piperidine ($C_5H_{11}N$), aniline ($C_6H_7N$), or the like may be used. Further, as the catalyst, for example, a chain amine such as triethylamine ($(C_2H_5)_3N$), diethylamine ($(C_2H_5)_2NH$), monoethylamine ($(C_2H_5)NH_2$), trimethylamine ($(CH_3)_3N$), dimethylamine ($(CH_3)_2NH$), monomethylamine ($(CH_3)NH_2$), or the like may be used. As the catalyst, one or more of these substances may be used. The same applies to the steps to be described later.

As the inert gas, for example, a nitrogen ($N_2$) gas, and a rare gas such as an argon (Ar) gas, a helium (He) gas, a neon (Ne) gas, a xenon (Xe) gas or the like may be used. One or more of these gases may be used as the inert gas. The same applies to the respective steps to be described later.

After the first layer is formed on the surface of the wafer 200 (the upper surface and the inner surface of the concave structure), the valves 243*c* and 243*d* are closed to stop the supply of the second processing gas and the catalyst into the process chamber 201. While keeping the valve 243*b* open, the supply of the inert gas into the process chamber 201 continues. Then, the inside of the process chamber 201 is vacuum-exhausted to remove gaseous substances remaining in the process chamber 201 from the inside of the process chamber 201. At this time, the valves 243*e* and 243*f* are opened to supply the inert gas into the process chamber 201 via the nozzles 249*a* and 249*c*. The inert gas supplied via the nozzles 249*a* and 249*c* acts as a purge gas, whereby the space in which the wafer 200 exists, i.e., the process chamber 201, is purged (purging).

[Step B+Step C]

After step D is completed, a first processing gas, a catalyst, and a dilution inert gas are supplied toward the first region 210*a* and the second region 210*b* in the process chamber 201. In the embodiments of the present disclosure, steps B and C are performed simultaneously.

Specifically, the valves 243*a* and 243*d* are opened to allow the first processing gas to flow through the gas supply pipe 232*a* and allow the catalyst to flow through the gas supply pipe 232*d*, respectively. The flow rates of the first processing gas and the catalyst are regulated by the MFCs 241*a* and 241*d*, respectively. The first processing gas and the catalyst are supplied into the process chamber 201 via the nozzle 249*a* (R1), and are exhausted via the exhaust port 231*a*. At this time, the second processing gas and the catalyst are supplied to the wafer 200 (supply of second processing gas+catalyst: step B). At this time, the valves 243*e* and 243*f* may be opened to supply an inert gas into the process chamber 201 via the nozzles 249*a* (R1) and 249*c* (R3), respectively.

At this time, the inert gas is allowed to continuously flow through the gas supply pipe 232*b* while keeping the valve 243*b* open. The flow rate of the inert gas is regulated by the MFC 241*b*. The inert gas is supplied into the process chamber 201 via the nozzle 249*b* (R2), and is exhausted via the exhaust port 231*a* (Step C).

Processing conditions in this step (step B+step C) are exemplified as follows:

Supply flow rate of first processing gas: 1 to 2,000 sccm
Supply flow rate of catalyst: 1 to 2,000 sccm
Supply flow rate of inert gas (R2): 1 to 20,000 sccm
Supply flow rate of inert gas (for each of R1 and R3): 0 to 20,000 sccm
Supply time for each gas: 1 to 100 seconds, specifically 5 to 60 seconds
Processing temperature: room temperature (25 degrees C.) to 200 degrees C., specifically room temperature to 150 degrees C.
Processing pressure: 133 to 1,333 Pa.

By supplying the first processing gas (reaction gas) to the wafer 200 under the above-described processing conditions, at least a portion of the first layer formed on the wafer 200 reacts with the first processing gas and is modified. As a result, a second layer, which is a modified layer of the first layer, is formed on the wafer 200.

In this step, by supplying the catalyst together with the first processing gas, it becomes possible to allow the above-described reaction to proceed under the above-described low temperature condition.

In step B, the first processing gas is supplied under a condition where there is a sufficiently high probability that the first processing gas will be physically adsorbed on the plurality of wafers 200, for example, a condition where a probability that the first processing gas will be physically adsorbed on the wafers 200 is higher than a probability that the first processing gas will be chemically adsorbed on the wafers 200 (i.e., under a condition where the physical adsorption is dominant). Specifically, for example, the first processing gas is supplied under the low temperature condition described above.

In a case where the processing temperature is lower than the room temperature (25 degrees C.), the chemical adsorption may be suppressed, and a rate at which the first layer is modified by the chemically adsorbed first processing gas (i.e., a deposition rate) may decrease. By setting the processing temperature to 25 degrees C. or higher, it is possible to generate the chemical adsorption to increase the rate at which the first layer is modified.

In a case where the processing temperature exceeds 200 degrees C., an amount of heat applied to the wafer 200 may become excessive, and a thermal history of the heat applied to the wafer 200 may not be well controlled. Furthermore, in a case where the processing temperature exceeds 200 degrees C., the probability that the first processing gas will be physically adsorbed on the wafer 200 may decrease, and a rate at which the first layer is modified by the physically adsorbed first processing gas (i.e., a deposition rate) may decrease. In particular, in a case where a gas that is likely to be physically adsorbed is used as the first processing gas, when a probability that the gas will be physically adsorbed decreases, a desired deposition rate may not be obtained. By setting the processing temperature to 200 degrees C. or less, the amount of heat applied to the wafer 200 may be reduced, and the thermal history of the heat applied to the wafer 200 may be well controlled. Furthermore, by setting the processing temperature to 200° C. or less, the probability that the first processing gas will be physically adsorbed on the wafer 200 may increase, and the rate at which the first layer is modified by physical adsorption may be ensured. In particular, in the case where the gas that is likely to be physically adsorbed is used as the first processing gas, when the probability that the gas will be physically adsorbed increases, the desired deposition rate may be easily obtained. Further, since contribution of the physical adsorption to the deposition rate becomes larger, an effect obtained by supplying the inert gas in step C becomes more remarkable. By setting the processing temperature to 150 degrees C. or less, the amount of heat applied to the wafer 200 may be further reduced, and the thermal history of the heat applied to the wafer 200 may be better controlled. Furthermore, by setting the processing temperature to 150 degrees C. or less, the probability that the first processing gas will be physically adsorbed on the wafer 200 may be further increased, and the rate at which the first layer is modified by the physical adsorption may be increased. Further, since the contribution of physical adsorption to the deposition rate becomes larger, the effect obtained by supplying the inert gas in step C becomes more remarkable.

According to the configuration of the gas supply holes 250*a* and 250*c* described above, in step B, the second processing gas and the catalyst are supplied at the same flow rate toward both the first region 210*a* and the second region 210*b* (see FIG. 6).

Further, according to the configuration of the gas supply holes 250*b* described above, in step C, the inert gas is supplied toward the first zone and the third zone at a flow rate (a second flow rate) smaller than a flow rate (a first flow rate) of the inert gas supplied toward the second zone (see FIGS. 5 and 6).

Further, according to the configuration of the gas supply holes 250*b* described above, in step C, the inert gas is supplied toward the second region 210*b* at a flow rate smaller than the flow rate of the inert gas supplied toward the first zone and the third zone (see FIGS. 5 and 6).

Further, according to the configuration of the gas supply holes 250*b* described above, in step C, the inert gas is supplied toward the second region 210*b* at a flow rate smaller than the flow rate of the inert gas supplied toward the second zone (see FIGS. 5 and 6).

In step C, the inert gas is supplied so as to suppress physical adsorption of the first processing gas on the surfaces of the plurality of product wafers 200*a*.

In step C, the inert gas is supplied so as to desorb at least a portion of the first processing gas physically adsorbed on the product wafers 200*a*.

In step C, the inert gas is supplied so as to purge the first processing gas remaining in the space between the product wafers 200*a*.

As the first processing gas, for example, an oxygen (O)- and H-containing gas (O- and H-containing substance or oxidizing gas) may be used. As the O- and H-containing gas, a water vapor ($H_2O$ gas), a hydrogen peroxide ($H_2O_2$) gas, hydrogen ($H_2$) gas+oxygen ($O_2$) gas, $H_2$ gas+ozone ($O_3$) gas, or the like may be used. That is, as the O- and H-containing gas, O-containing gas+H-containing gas may also be used. In this case, a deuterium ($^2H_2$) gas may be also used as the H-containing gas, instead of the $H_2$ gas.

Description of two gases together, such as "$H_2$ gas+$O_2$ gas" in the present disclosure means a mixed gas of a $H_2$ gas and an $O_2$ gas. When supplying the mixed gas, the two gases may be mixed (premixed) in a supply pipe and then supplied into the process chamber 201, or the two gases may be separately supplied into the process chamber 201 from different supply pipes and then mixed (post-mixed) within the process chamber 201.

Further, as the first processing gas, an O-containing gas (O-containing substance or oxidizing gas) may be used. The O-containing gas may be an $O_2$ gas, an ozone ($O_3$) gas, a nitrous oxide ($N_2O$) gas, a nitric oxide (NO) gas, a nitrogen dioxide ($NO_2$) gas, carbon monoxide (CO) gas, a carbon dioxide ($CO_2$) gas, or the like.

As the first processing gas, one or more of these gases may be used.

Further, as the first processing gas, a gas that is likely to be physically adsorbed on the wafer 200 may be used appropriately. For example, an O-containing gas (an oxidizing gas) may be appropriately used as the gas that is likely to be physically adsorbed on the wafer 200. Further, for example, as the gas that is likely to be physically adsorbed on the wafer 200, an O- and H-containing gas, particularly a gas that contains O and H in one molecule (i.e., $H_2O$ gas, $H_2O_2$ gas, etc.), may be more appropriately used.

After the first layer formed on the surface of the wafer 200 (the upper surface and the inner surface of the concave structure) is modified to the second layer, the valves 243*a* and 243*d* are closed to stop the supply of the first processing gas and the catalyst into the process chamber 201.

Then, the inside of the process chamber 201 is vacuum-exhausted to remove gaseous substances remaining in the process chamber 201 from the inside of the process chamber 201. At this time, the valves 243*e* and 243*f* are opened to supply an inert gas into the process chamber 201 via the nozzles 249*a* and 249*c*. Further, at this time, the valve 243*b* is kept open, and the flow rate of the inert gas supplied from the nozzle 249*b* into the process chamber 201 is reduced. The inert gas supplied from the nozzles 249*a*, 249*b*, and 249*c* acts as a purge gas, whereby the space in which the wafer 200 exists, i.e., the inside of the process chamber 201, is purged (purging). At this time, the valve 243*b* may be closed to stop the supply of the inert gas into the process chamber 201 from the nozzle 249*b*.

[Performing a Predetermined Number of Times]

By performing a cycle including performing the above-described steps B to D in the above-described order n times (where n is an integer of 1 or 2 or more), it is possible to form a film with a desired composition on the surface of the wafer 200 (the upper surface and inner surface of the concave structure). For example, in a case where the above-described Si-containing gas is used as the second processing gas (precursor gas) and the above-described O-containing gas (oxidizing gas) is used as the first processing gas (reaction gas), a silicon oxide film (SiO film) is formed on the surface of the wafer 200. The above-described cycle may be performed multiple times. In other words, a thickness of the second layer formed per cycle may be set to be smaller than a desired film thickness, and the above-described cycle may be performed multiple times until a film formed by stacking the second layers reaches the desired film thickness.

(After-Purge and Returning to Atmospheric Pressure)

After the film formation process is completed, an inert gas as a purge gas is supplied into the process chamber 201 from each of the nozzles 249*a* to 249*c* and is exhausted via the exhaust port 231*a*. Thus, the inside of the process chamber 201 is purged, such that gases, reaction by-products, and the like remaining in the process chamber 201 are removed from the inside of the process chamber 201 (after-purge). Thereafter, an internal atmosphere of the process chamber 201 is replaced with an inert gas (replacement of inert gas), and an internal pressure of the process chamber 201 is returned to the atmospheric pressure (returning to atmospheric pressure).

(Boat Unloading and Wafer Discharging)

Thereafter, the seal cap 219 is lowered by the boat elevator 115, and the lower end of the manifold 209 is opened. Then, the processed wafers 200 supported by the boat 217 are unloaded from the lower end of the manifold 209 to the outside of the reaction tube 203 (boat unloading). After the boat is unloaded, the shutter 219*s* is moved, and the lower end opening of the manifold 209 is sealed by the shutter 219*s* via the O-ring 220*c* (shutter closing). The processed wafers 200 are unloaded to the outside of the reaction tube 203 and then are discharged from the boat 217 (wafer discharging).

(3) Effects of the Embodiments

According to the embodiments of the present disclosure, one or more of the following effects may be obtained.

(a) In step C, when the first processing gas is supplied in step B, the inert gas is supplied toward the first zone and the third zone at the flow rate (the second flow rate) smaller than the flow rate (the first flow rate) of the inert gas supplied toward the second zone. This makes it possible to control a distribution of processing amounts for the product wafers 200*a* so as to be a desired distribution, for example, a uniform distribution, among the plurality of product wafers 200*a*. This will be described below.

For example, a portion of the first processing gas supplied to the wafer 200 in step B may be adsorbed on the surface of the wafer 200, and may then be desorbed from the wafer 200 at a predetermined timing and move within the process chamber 201. The first processing gas moving within the process chamber 201 may be re-adsorbed on another wafer 200 within the process chamber 201. Hereinafter, phenomenon in which the processing gas is desorbed from the wafer 200, moves, and is re-adsorbed on another wafer 200 after the processing gas is supplied will be generally referred to as "diffusion."

Herein, in the wafer arrangement region in the process chamber 201, the amount of the first processing gas desorbed from the wafers 200 may vary depending on the region. Specifically, a concentration of the first processing gas desorbed from the wafers 200 (i.e., an amount of the first processing gas per unit volume of a space in the wafer arrangement region) may vary between the second zone on the center side of the first region 210*a* and the first zone and the third zone on both end sides adjacent to the second regions 210*b* (hereinafter, sometimes referred to as "between zones"). More specifically, this is as follows.

In the first region 210*a* (particularly the second zone) in the wafer arrangement region, the product wafers 200*a* with larger surface areas than the dummy wafers 200*b* are arranged. Therefore, a total area of the substrate surface existing per unit volume of a space in the first region 210*a* is larger than a total area of the substrate surface existing per unit volume of a space in the second region 210*b*. As a result, in the first region 210*a*, the concentration of the first processing gas desorbed from the wafers 200 after the first processing gas is supplied becomes relatively large. On the other hand, in the second region 210*b* of the wafer arrangement region, the dummy wafers 200*b* with smaller surface areas than the product wafers 200*a* are arranged. Therefore, a total area of the substrate surface existing per unit volume of the space in the second region 210*b* is smaller than a total area of the substrate surface existing per unit volume of the space in the first region 210*a* (particularly the second zone). As a result, in the second region 210*b*, the concentration of the first processing gas desorbed from the wafer 200 after the first processing gas is supplied becomes relatively small. When a difference in concentration of the first processing gas desorbed from the wafer 200 occurs between the first region 210*a* and the second region 210*b* in this manner, the first processing gas desorbed from the product wafers 200*a* moves (goes around) from the ends of the first region 210*a* adjacent to the second regions 210*b*, i.e., the first zone and the third zone, to the second region 210*b*. As a result, in the first zone and the third zone, the concentration of the first processing gas desorbed from the product wafers 200*a* decreases. On the other hand, since the second zone is not adjacent to the second regions 210*b*, movement (outflow) of the processing gas desorbed from the product wafers 200*a* is unlikely to occur in the second zone. As a result, the concentration of the first processing gas desorbed from the wafers 200 becomes higher in the second zone than in the first zone and the third zone.

As a result, an amount of the first processing gas re-adsorbed on the product wafers 200*a* arranged in the first zone and the third zone may decrease, and an amount of the first processing gas re-adsorbed on the product wafers 200*a* arranged in the second zone may increase. Such a variation in the amount of adsorption of the first processing gas after the diffusion among the product wafers 200*a* may cause a difference in the processing amount for the product wafers 200*a* among the zones. For example, in the above-described film formation process, a difference in the deposition rate may occur among the zones. Further, these matters are particularly noticeable when the surface areas of the product wafers 200*a* arranged in the first region 210*a* are large.

As described above, in the present disclosure, the areas of the gas supply holes 250*b* per unit length in the direction perpendicular to the surface of the wafer 200 are set to be larger in the portion facing the second zone than in the portions facing the first zone and the third zone (see FIG. 5). As a result, in step C, when the first processing gas is supplied in step B, the inert gas may be supplied toward the first zone and the third zone at a flow rate smaller than the flow rate of the inert gas supplied toward the second zone (see FIG. 6). That is, in step C, the first processing gas may be diluted with the inert gas such that the concentration of the first processing gas supplied toward the second zone is lower than the concentration of the first processing gas supplied toward the first zone and the third zone.

In step C, by supplying the inert gas with the above-described flow rate distribution, in step B, the amount of the first processing gas adsorbed on the product wafers 200*a* arranged in the second zone may be made smaller than the amount of the first processing gas adsorbed on the product wafers 200*a* arranged in the first zone and the third zone. This makes it possible to make the amount of the first processing gas re-adsorbed on the product wafers 200*a* arranged in the second zone closer to the amount of the first processing gas re-adsorbed on the product wafers 200*a* arranged in the first zone and the third zone. In this manner, it is possible to eliminate the variation in the amount of adsorption of the first processing gas among the zones after the first processing gas is diffused. As a result, it is possible to control the distribution of the processing amounts for the product wafers 200*a* so as to be a desired distribution, for example, a uniform distribution, among the plurality of product wafers 200*a*.

(b) In step B, the first processing gas is supplied from nozzle 249*a*, and in step C, the inert gas is supplied from nozzle 249*b* different from nozzle 249*a*. This allows the first processing gas and the dilution inert gas to be injected (supplied) from the gas supply holes formed with different arrangements, shapes, etc. As a result, in step C, the dilution inert gas may be supplied with a desired injection pattern (a flow rate distribution) without being affected by an injection pattern (a flow rate distribution) of the first processing gas in step B.

In step C, by supplying the inert gas toward at least the second zone, it is possible to reliably reduce the amount of adsorption of the first processing gas on the product wafers 200*a* arranged in the second zone in step B, thereby reliably obtaining the above-described effects.

(c) When step B is performed under a low temperature condition, for example, at the room temperature (25 degrees C.) or higher and 200 degrees C. or lower, a probability that the first processing gas will be physically adsorbed on the wafer 200 is higher than a probability that the first processing gas will be chemically adsorbed on the wafer 200. The first processing gas physically adsorbed on the wafer 200 is more likely to be desorbed from the wafer 200 than when the first processing gas is chemically adsorbed on the wafer 200. Therefore, when the first processing gas is supplied under a condition where there is a high probability that the first processing gas will be physically be adsorbed on the wafer 200, particularly under a condition where the physical adsorption is dominant, diffusion is likely to occur. That is, an influence of diffusion of the first processing gas in the above-described film formation process is likely to be large. As a result, the amount of adsorption of the first processing gas on the product wafers 200*a* is likely to vary among the zones after the first processing gas is diffused. The above-described effect may be particularly remarkable when step B is performed under the above-described low temperature condition as in the embodiments.

(d) In step B, when a gas that is likely to be physically adsorbed on the surface of the wafer 200 is used as the first processing gas, the gas is more likely to be desorbed from the wafer 200 after being adsorbed on the surface of the wafer 200 than when a gas that is likely to be chemically adsorbed is used. As a result, the amount of adsorption of the first processing gas on the product wafers 200*a* is more likely to vary among the zones after the first processing gas is diffused. The above-described effect may be particularly remarkable when the gas that is likely to be physically adsorbed on the surface of the wafer 200 is used as the first processing gas in step B as in the embodiments.

(e) By simultaneously performing steps B and C, the dilution inert gas may be supplied when supplying the first processing gas. Therefore, it is possible to regulate the amount of adsorption (particularly the amount of physical adsorption) of the first processing gas on the product wafers 200*a*.

(f) During the execution of step D, the inert gas is supplied from the inert gas nozzle (R2) toward the second zone at a flow rate smaller than the flow rate of the inert gas supplied from R2 toward the second zone during the execution of step B. This makes it possible to suppress a decrease in the concentration of the second processing gas in the second zone due to excessive dilution of the second processing gas by the inert gas when the second processing gas is supplied.

(g) In step A, by arranging the dummy wafers 200*b* with relatively small surface areas in the second region 210*b*, the concentration of the first processing gas desorbed from the product wafers 200*a* is likely to vary among the zones after the first processing gas is supplied in step B.

The above-described effect may be particularly remarkable when the dummy wafers 200*b* are arranged in the second region 210*b* in step A as in the embodiments.

(h) In step A, the dummy wafers 200*b* are not arranged in the first region 210*a*, that is, the product wafers 200*a* with relatively large surface areas are arranged in the first region 210*a*. As a result, the concentration of the first processing gas desorbed from the product wafers 200*a* is likely to vary among the zones after the first processing gas is supplied in step B. The above-described effect may be particularly remarkable when the dummy wafers 200*b* are not arranged in the first region 210*a* in step A as in the embodiments.

(i) In step C, the inert gas is supplied toward the second region 210*b* at a flow rate smaller than the flow rate of the inert gas supplied toward the second zone during the supply of the first processing gas in step B. By supplying the inert gas from the nozzle 249*b* with such a flow rate distribution, it is possible to further reduce the variation in concentration of the first processing gas desorbed from the product wafers 200*a* that occurs among the zones.

(j) In step C, the inert gas is supplied toward the second region 210*b* at a flow rate smaller than the flow rate of the inert gas supplied toward the first zone and the third zone during the supply of the first processing gas in step B. By supplying the inert gas from the nozzle 249*b* with such a flow rate distribution, it is possible to more effectively reduce the variation in concentration of the first processing gas desorbed from the product wafers 200*a* that occurs among the zones.

(k) In step B, by supplying the first processing gas toward at least a portion of the second region 210*b* (see FIG. 6), partial pressures of the first processing gas in the first zone and the third zone are regulated such that the first processing gas is reliably supplied to the first zone and the third zone in step B. This makes it possible to ensure, for example, the film thickness on the product wafers 200*a* arranged in the first zone and the third zone.

(l) By supplying the inert gas in step C, it is possible to reduce physical adsorption of the first processing gas supplied in step B on the surfaces of the product wafers 200*a*.

(m) By supplying the inert gas in step C, it is possible to purge the first processing gas supplied in step B and remaining in the spaces between the product wafers 200*a* without being adsorbed on the product wafers 200*a*. Specifically, the inert gas supplied to the first to third zones in step C may act to suppress re-adsorption of the first processing gas desorbed from the surfaces of the product wafers 200*a* by purging the spaces between the product wafers 200*a*. Therefore, by supplying the inert gas in step C with the above-described flow rate distribution, the amount of the first processing gas re-adsorbed on the product wafers 200*a* after the first processing gas is supplied in step B may be more effectively suppressed in the second zone than in the first and third zones.

(n) By supplying the inert gas in step C, at least a portion of the first processing gas supplied in step B and physically adsorbed on the product wafers 200*a* may be desorbed and exhausted from the process chamber 201. Specifically, the inert gas supplied to the first to third zones in step C may act to purge the surfaces of the product wafers 200*a*, thereby causing the first processing gas (particularly the physically adsorbed first processing gas) adsorbed on the surfaces of the product wafers 200*a* to be physically desorbed from the surfaces of the product wafers 200*a* and exhausted from the process chamber 201 without being re-adsorbed. Therefore, by supplying the inert gas in step C with the flow rate distribution as described above, the amount of the first processing gas that is likely to be adsorbed and diffused on the surfaces of the product wafers 200*a* may be more effectively reduced in the second zone than in the first and third zones.

(4) Modifications (i) The nozzle 249*b* and the gas supply holes 250*b* in the above-described embodiments may be modified as shown in the following modifications. Hereinafter, elements different from those of the above-described embodiments will be described.

First Modification

Figure 7A:
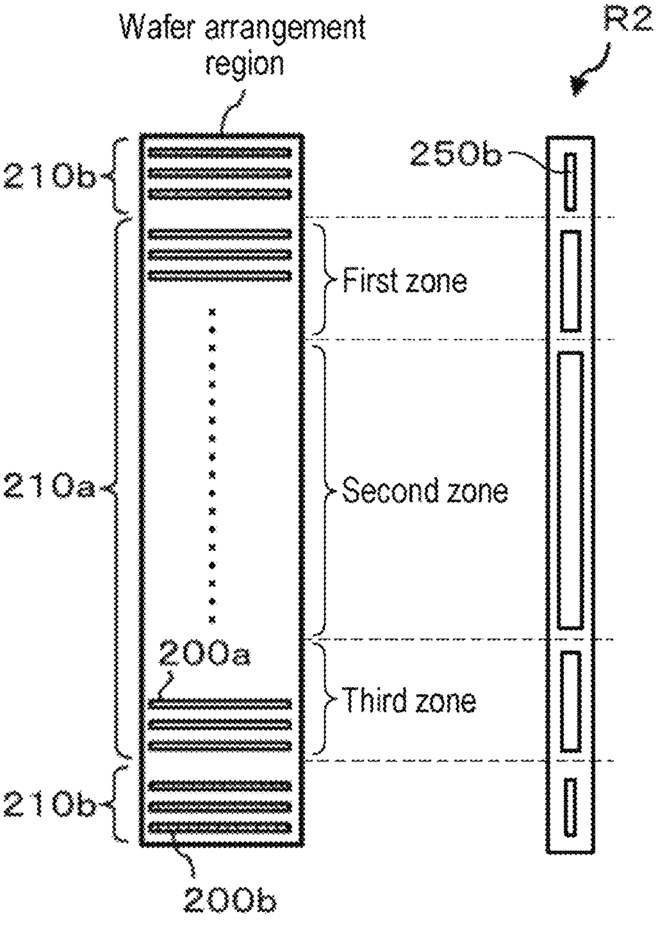
FIGS. 7A to 7I are diagrams showing modifications of the schematic configuration of the second nozzle suitably used in some embodiments of the present disclosure.

In the above-described embodiments, the case where the gas supply holes 250*b* are formed in the circular or elliptical shape are described by way of example. However, in the present disclosure, the shape of the gas supply holes 250*b* is not particularly limited, and the gas supply holes 250*b* may be formed in a slit shape, for example, as shown in FIG. 7A. In this modification, slits are formed such that sizes of widths of the slits are in the following order: second zone>first zone and third zone>second region 210*b*. Further, in the above-described embodiments, the plurality of gas supply holes 250*b* are respectively formed in the first to third zones and in each of the second regions 210*b*. However, in the present disclosure, the number of gas supply holes 250*b* in each zone and the like is not particularly limited, and for example, as shown in FIG. 7A, the gas supply holes 250*b* may be formed such that one gas supply hole 250*b* is formed in each of the first to third zones and the second regions 210*b*. The flow rate distribution of the inert gas injected from the gas supply holes 250*b* in this modification is as shown in FIG. 6.

In this modification as well, the same effects as those of the above-described embodiments may be obtained.

Second Modification

Figure 7B:
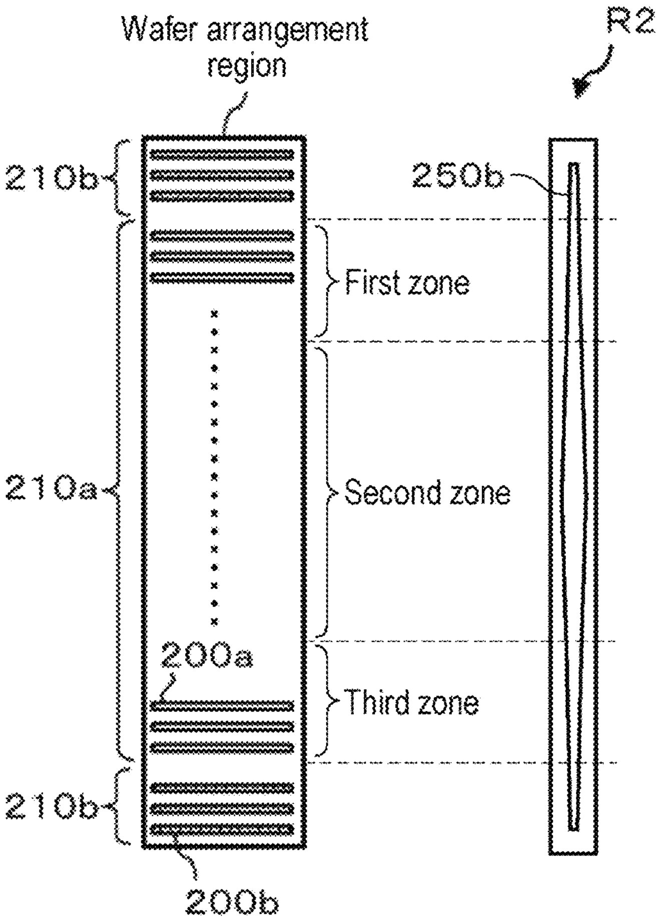

In the above-described embodiments, the case where the plurality of gas supply holes 250*b* are formed are described by way of example. However, in the present disclosure, the number of gas supply holes 250*b* in the nozzle 249*b* is not particularly limited, and for example, as shown in FIG. 7B, one slit-like gas supply hole 250*b* may be formed from an upper side to a lower side of the nozzle 249*b*. In this modification, a slit is formed such that a width of the slit gradually or stepwise decreases from the second zone to the first zone (or the third zone) and the second region 210*b*. The flow rate distribution of the inert gas discharged from the gas supply hole 250*b* in this modification is as shown in FIG. 6.

In this modification as well, the same effects as those of the above-described embodiments may be obtained.

Third Modification

Figure 7C:
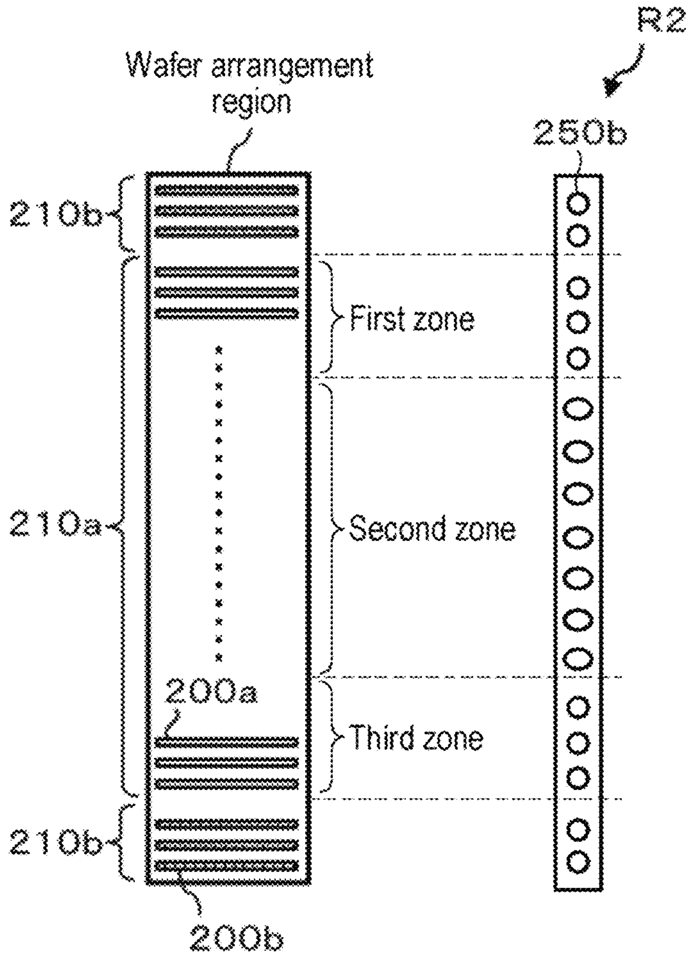
Figure 8A:
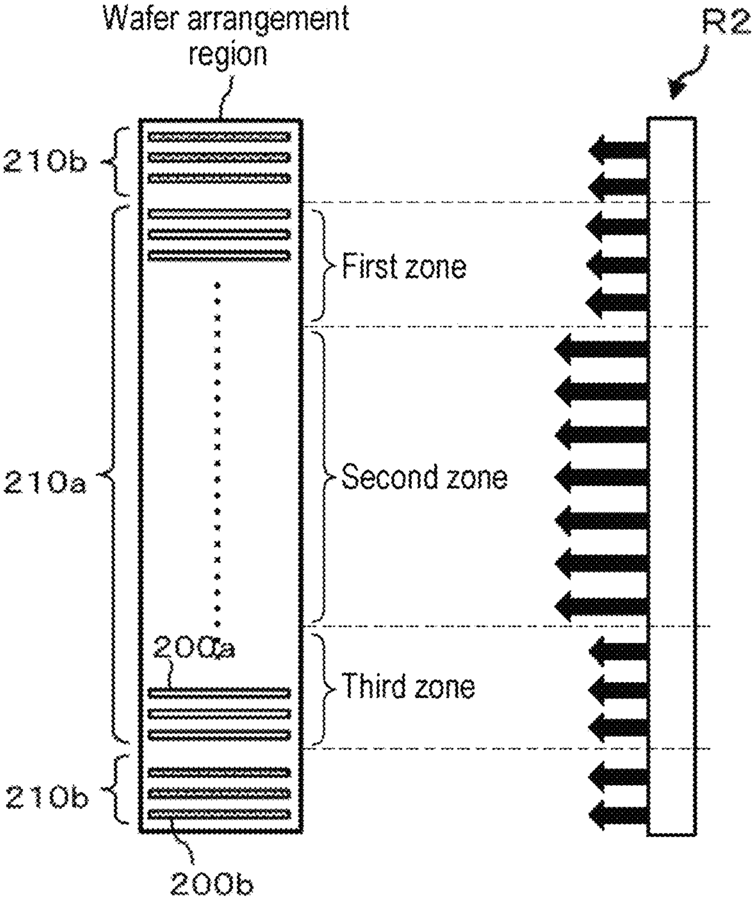
FIGS. 8A to 8E are diagrams showing modifications of a flow rate distribution of the inert gas supplied from a second nozzle suitably used in some embodiments of the present disclosure.

As shown in FIG. 7C, the opening areas of the gas supply holes 250*b* per unit length in the direction perpendicular to the surface of the wafer 200 may not be larger in the portions facing the first zone and the third zone than in the portions facing the second regions 210*b*. In this modification, an opening area of each of gas supply holes 250*b* formed in the first zone and the third zone is approximately the same as an opening area of each of gas supply holes 250*b* formed in the second region 210*b*. The flow rate distribution of the inert gas injected from the gas supply holes 250*b* in this modification is as shown in FIG. 8A.

In this modification as well, the same effects as those of the above-described embodiments may be obtained.

Fourth Modification

Figure 7D:
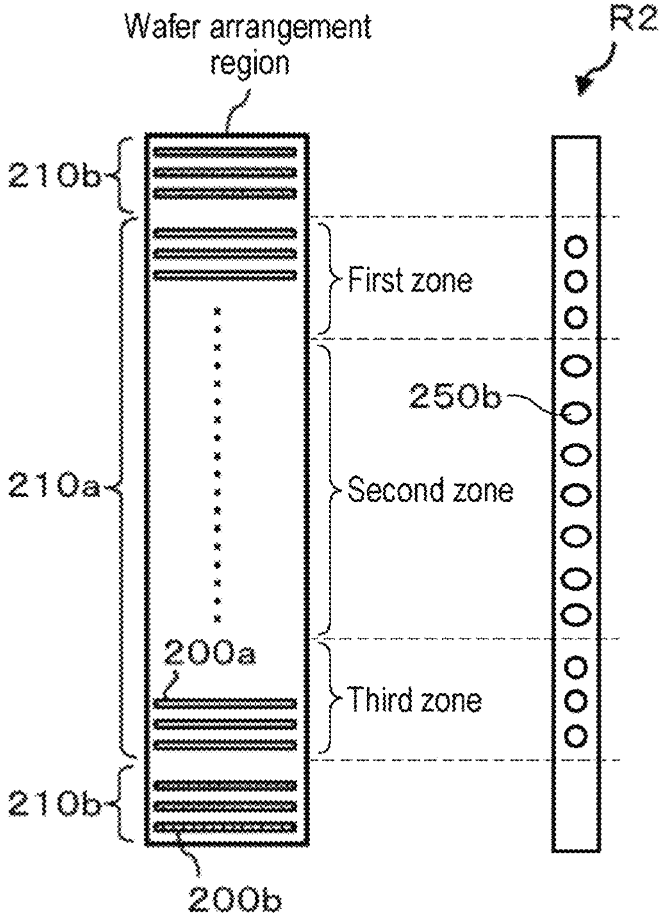
Figure 8B:
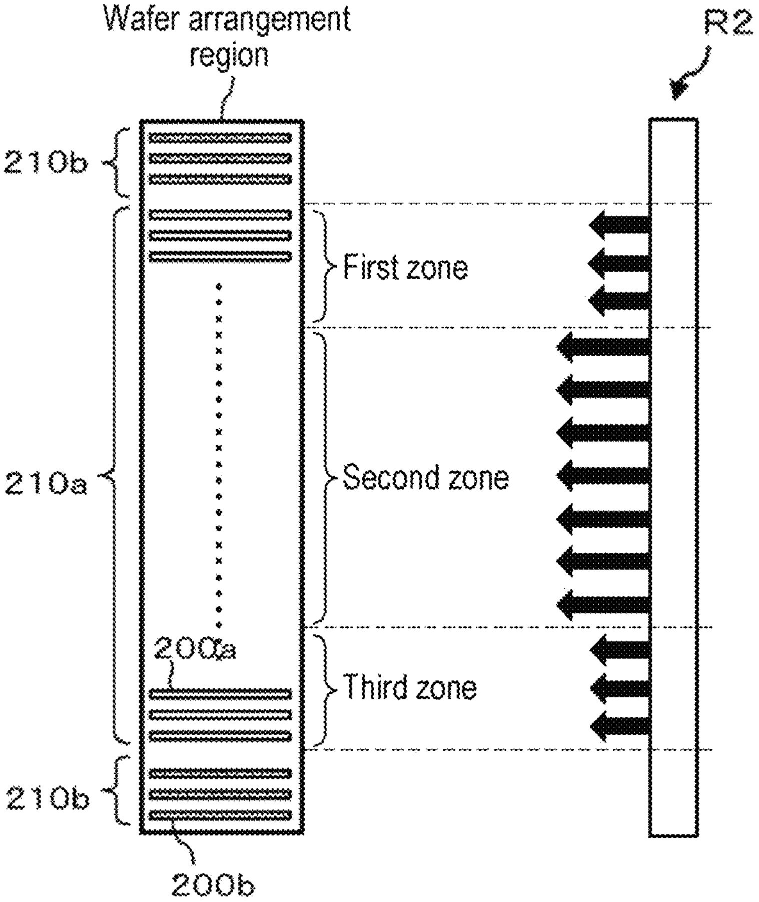

As shown in FIG. 7D, the gas supply holes 250*b* may not be formed in the portions facing the second regions 210*b*. In other words, in step C, the supply of the inert gas from the gas supply holes 250*b* toward the second regions 210*b* may not be performed. The flow rate distribution of the inert gas injected from the gas supply holes 250*b* in this modification is as shown in FIG. 8B.

In this modification as well, the same effects as those of the above-described embodiments may be obtained.

Fifth Modification

Figure 7E:
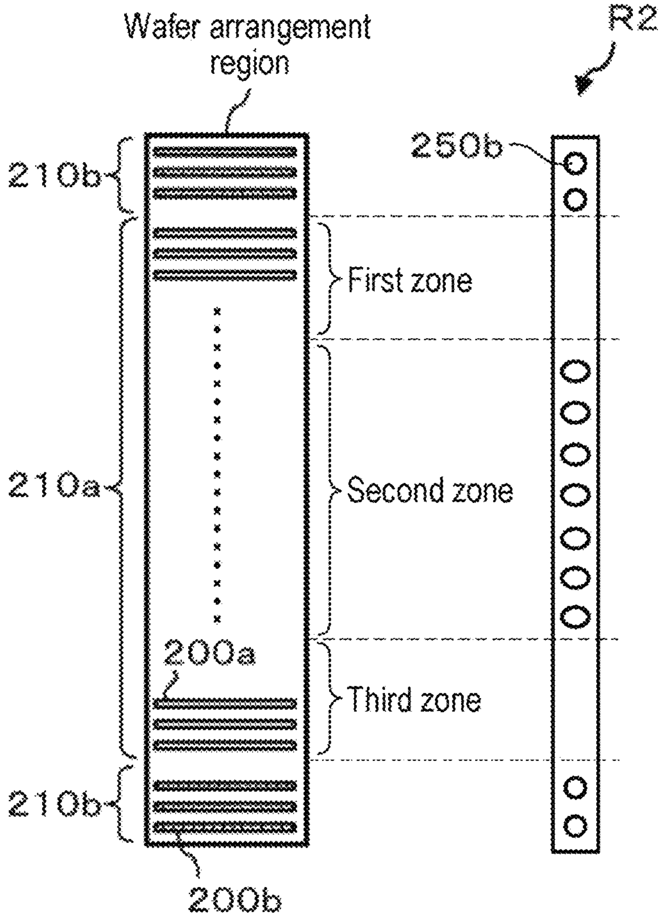
Figure 8C:
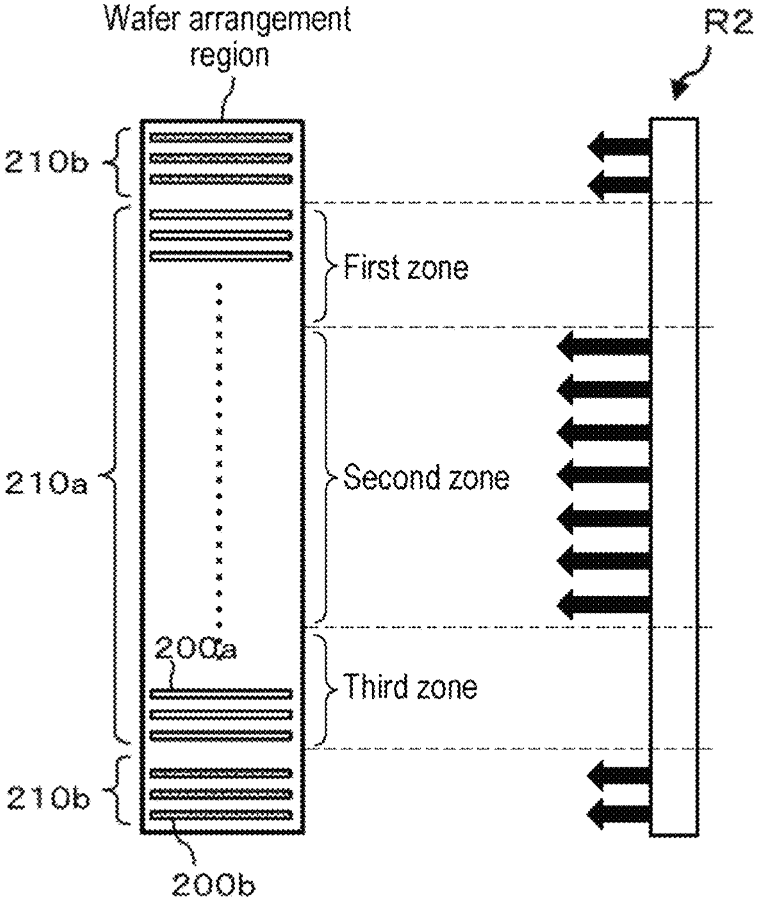

As shown in FIG. 7E, the gas supply holes 250*b* may not be formed in the portions facing the first zone and the third zone. That is, in step C, the supply of the inert gas toward the first zone and the third zone may not be performed, and the inert gas may be supplied toward the second regions 210*b*. The flow rate distribution of the inert gas injected from the gas supply holes 250*b* in this modification is as shown in FIG. 8C.

In this modification as well, the same effects as those of the above-described embodiments may be obtained. In this modification, the partial pressure of the first processing gas in the first and third zones may be increased by making the partial pressure of the inert gas in the second regions 210*b* higher than the partial pressure of the inert gas in the first and third zones during the supply of the first processing gas. Thus, adsorption of the first processing gas on the product wafers 200*a* arranged in the first and third zones may be promoted and deviation in a processing amount between the product wafers 200*a* arranged in the second zone and the product wafers 200*a* arranged in the first and third zones may be reduced.

Sixth Modification

Figure 7F:
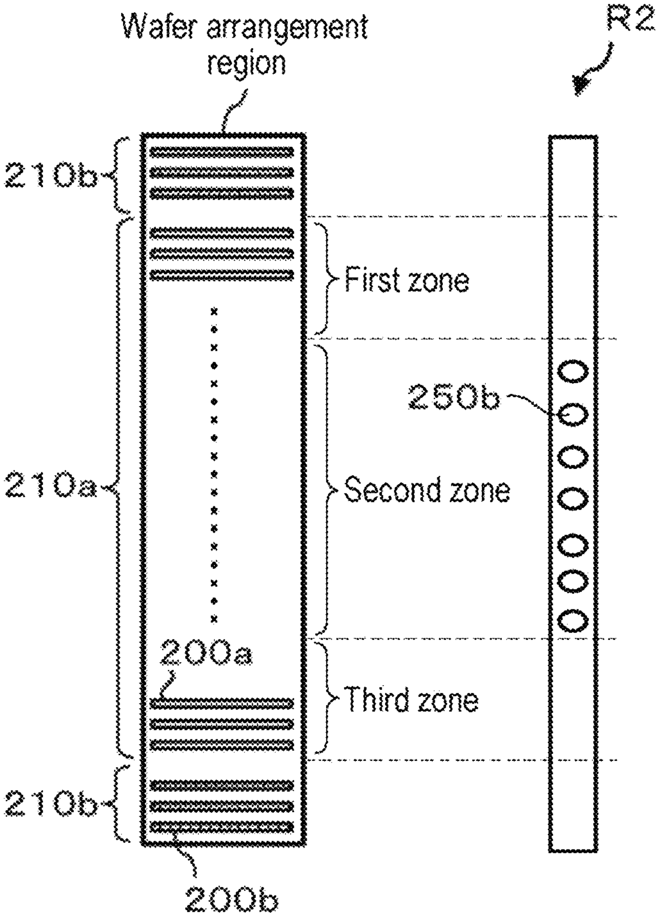
Figure 8D:
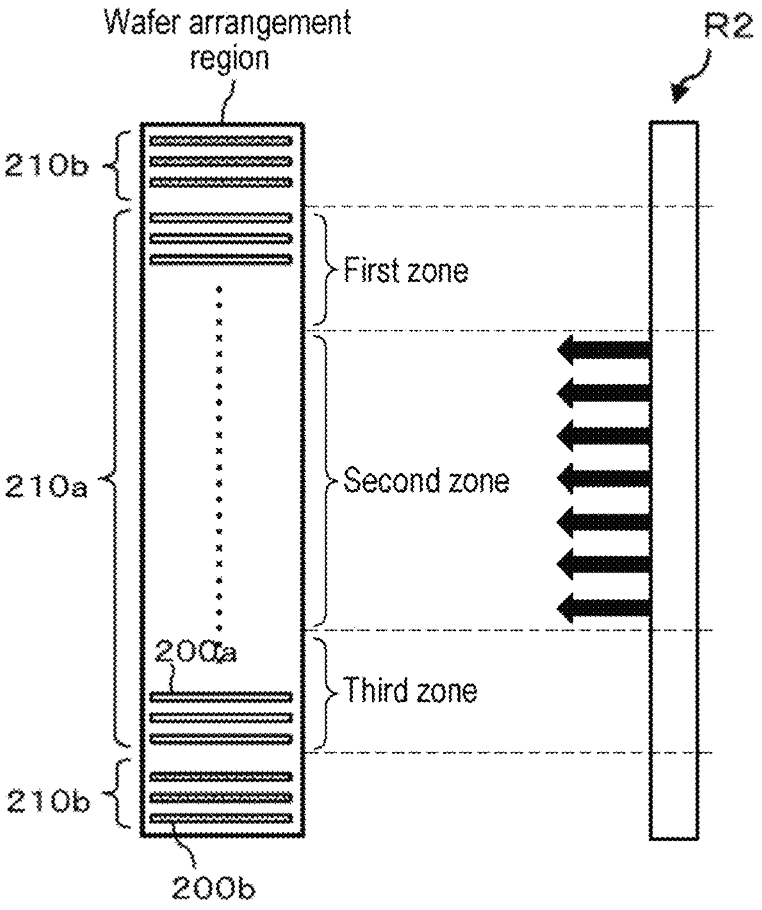

As shown in FIG. 7F, the gas supply holes 250*b* may not be formed in the portions facing the first and third zones and the second regions 210*b*. In other words, in step C, the supply of the inert gas toward the first and third zones and the second regions 210*b* may not be performed. The flow rate distribution of the inert gas injected from the gas supply holes 250*b* in this modification is as shown in FIG. 8D.

In this modification as well, the same effects as those of the above-described embodiments may be obtained. Further, in this modification, when the first processing gas is supplied, a large amount of the first processing gas may be adsorbed on the product wafers 200*a* arranged in the first and third zones and the dummy wafers 200*b* arranged in the second regions 210*b*. Thus, it is possible to increase the concentration of the first processing gas in the first and third zones when the first processing gas is diffused. As a result, it is possible to enhance the effect of improving the variation in the concentration of the first processing gas among the zones.

Seventh Modification

Figure 7G:
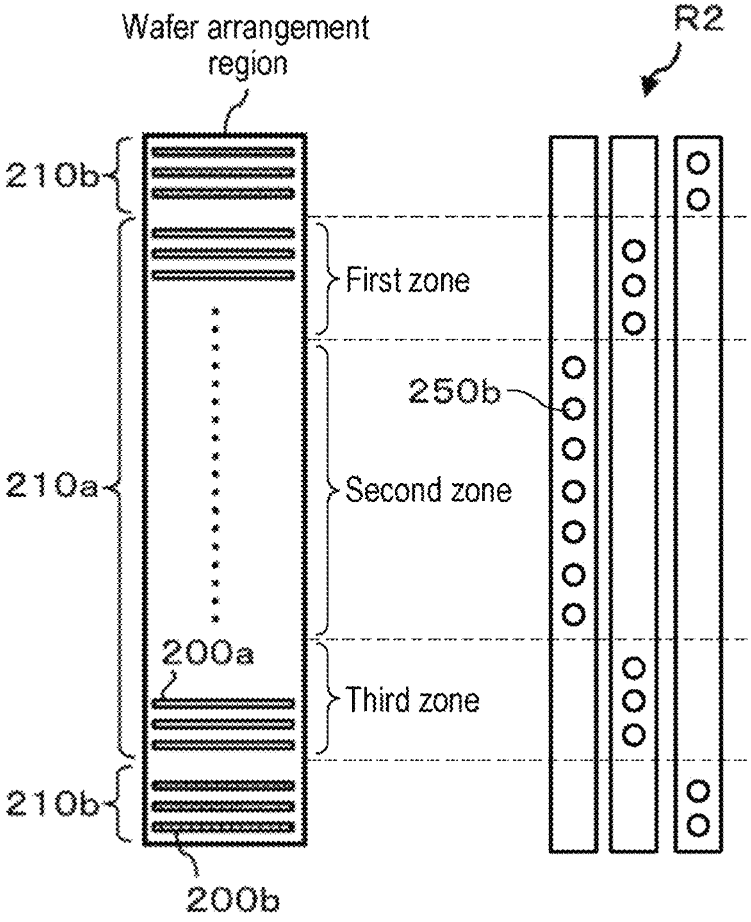
Figure 7H:
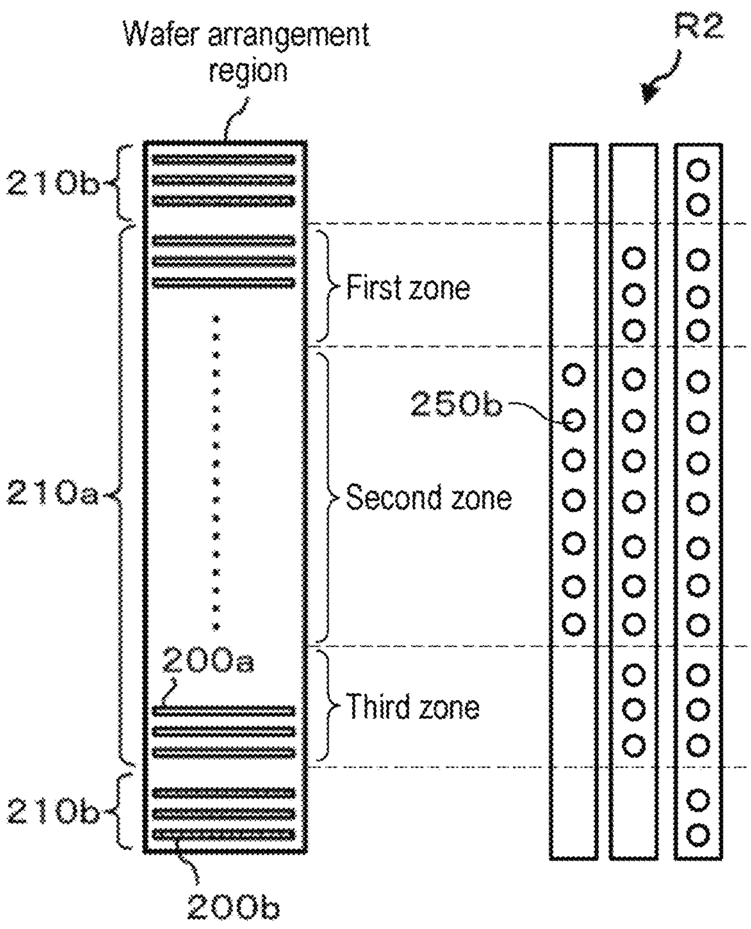

As shown in FIG. 7G or FIG. 7H, a plurality of nozzles 249*b* may be formed. In this modification, at least, one of the plurality of nozzles 249*b* includes gas supply holes 250*b* in the portion facing the second zone, and another one of the plurality of nozzles 249*b* includes gas supply holes 250*b* in the portions facing the first zone and the third zone. In the modification shown in FIG. 7G, three nozzles 249*b* are installed, the first one of which includes gas supply holes 250*b* in the portion facing the second zone, the second one of which includes gas supply holes 250*b* in the portions facing the first zone and the third zone, and the third one of which includes gas supply holes 250*b* in the portions facing the second regions 210*b*. In the modification shown in FIG. 7H, three nozzles 249*b* are installed, the first one of which includes gas supply holes 250*b* in the portion facing the second zone, the second one of which includes gas supply holes 250*b* in the portions facing the first to third zones, and the third one of which includes gas supply holes 250*b* in the portions facing the first to third zones and the second regions 210*b*. In these modifications, for example, the gas supply holes 250*b* may be formed with the same opening area and may be spaced apart from each other at equal intervals.

The flow rate distribution of the inert gas injected from the gas supply holes 250*b* in this modification may be manipulated by regulating the supply flow rate or the like in each nozzle 249*b*. For example, according to the modification shown in FIG. 7G, the flow rate distribution of the inert gas injected from the gas supply holes 250*b* may be set to any of the aspects shown in FIG. 6 and FIGS. 8A to 8E by regulating the supply flow rate in each nozzle 249*b*. Further, for example, according to the modification shown in FIG. 7H, the flow rate distribution of the inert gas injected from the gas supply holes 250*b* may be set to any of the aspects shown in FIG. 6, FIG. 8B, and FIG. 8D by regulating the supply flow rate in each nozzle 249*b*.

In this modification as well, the same effects as those of the above-described embodiments may be obtained. Further, in this modification, since the plurality of nozzles 249*b* are installed, the flow rate of the inert gas supplied toward the second zone and the flow rates of the inert gas supplied toward the first zone and the third zone may be easily controlled in step C.

(ii) The processing sequence in the above-described embodiments may be modified as shown in the following modifications. These modifications may be combined as desired. Unless otherwise specified, the processing procedure and processing conditions in each step of each modification may be the same as the processing procedure and processing conditions in each step of the above-described processing sequence.

Eighth Modification

In step C, the supply of the inert gas may be stopped after the supply of the first processing gas in step B is stopped.

In this modification as well, the same effects as those of the above-described embodiments may be obtained. Further, in this modification, it is possible to more effectively regulate the amount of the first processing gas adsorbed on the product wafers 200*a* arranged in the first to third zones. In particular, it is possible to further regulate the amount of the first processing gas re-adsorbed on the product wafers 200*a* after the supply of the first processing gas is stopped.

Ninth Modification

Step C may be performed after step B, and non-simultaneously with step B.

In this modification as well, at least a part of the effects of the above-described embodiments may be obtained. Further, in this modification, after the supply of the first processing gas, the first processing gas physically adsorbed on the product wafers 200*a* is purged (removed), thereby regulating the amount of the first processing gas adsorbed on the product wafers 200*a*.

Tenth Modification

During the execution of step D, a dilution inert gas may be supplied toward the second zone, and a dilution inert gas may be supplied toward at least one selected from the group of the first zone and the third zone at a flow rate equal to or greater than the flow rate of the dilution inert gas supplied toward the second zone.

In this modification as well, the same effects as those of the above-described embodiments may be obtained. A concentration of the second processing gas (precursor gas) supplied in step D may be relatively high in the first zone and the third zone and relatively low in the second zone. This is because a consumption amount (adsorption amount) of the second processing gas per unit volume is relatively small in the second regions 210*b* in which the dummy wafers 200*b* with a small surface area are arranged, and the second processing gas that is not consumed may move (go around) to the adjacent first zone and the adjacent third zone. In this modification, by supplying the dilution inert gas with the flow rate distribution described above when the second processing gas is supplied, the concentration of the second processing gas in each zone may be made to be nearly uniform. The supply of the dilution inert gas in this modification may be appropriately carried out particularly when a plurality of nozzles 249*b* (R2) are installed as shown in FIG. 7G and the flow rate distribution of the dilution inert gas is made changeable for each step.

Even when the second processing gas is supplied in step D, as in the case of supplying the first processing gas in step B, the gas concentration may vary between among zones and/or between the first region and the second region due to diffusion of the physically adsorbed gas. In such a case, in step D, the flow rate distribution of the dilution inert gas supplied to each of the first to third zones and/or each of the first and second regions may be the same as that in step C.

Eleventh Modification

As in the processing sequence shown below, it may be possible to perform:

- step A of arranging a plurality of product wafers 200*a*, each including a surface on which a concave structure is formed, in multiple stages in the first region 210*a* along a direction perpendicular to the surface, and arranging dummy wafers 200*b* in the second regions 210*b;*
- step B of supplying a first processing gas toward at least a portion of the first region 210*a*; and
- step C of supplying an inert gas at a first flow rate toward at least a portion of the first region 210*a*, and supplying an inert gas toward the second regions 210*b* at a flow rate smaller than the first flow rate of the inert gas supplied toward the first region 210*a*.

In step B of this modification, the first processing gas may be supplied from the nozzle 249*a* (R1). In step C of this modification, the inert gas may be supplied from one or more nozzles 249*b* (R2) toward the first region 210*a* and the second regions 210*b*. In step C of this modification, the inert gas may be supplied from one or more nozzles R2 toward at least a portion of the first region 210*a* at a first flow rate, and the inert gas may be supplied from one or more nozzles R2 toward the second regions 210*b* at a second flow rate smaller than the first flow rate.

Figure 7I:
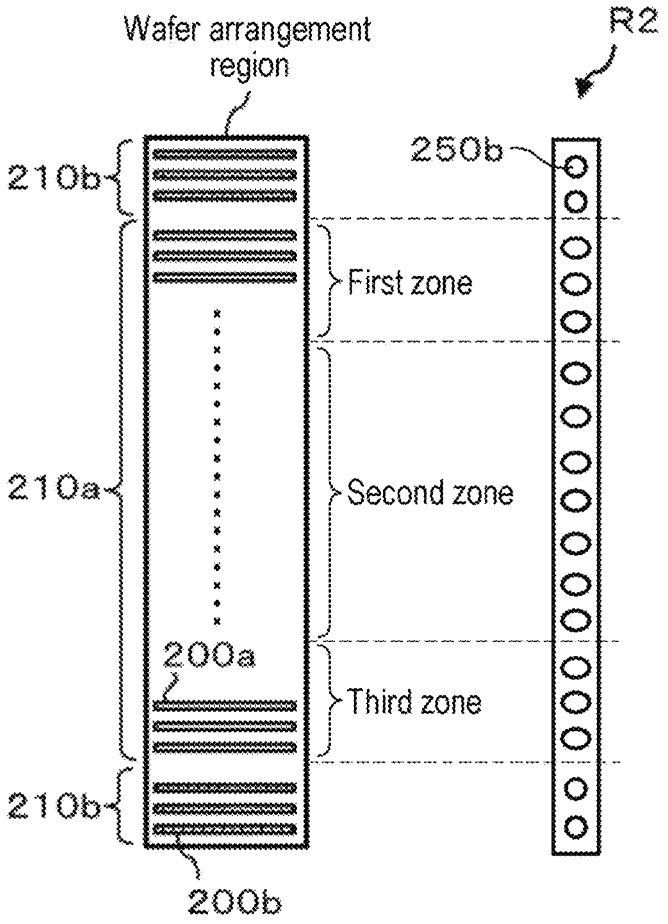
Figure 8E:
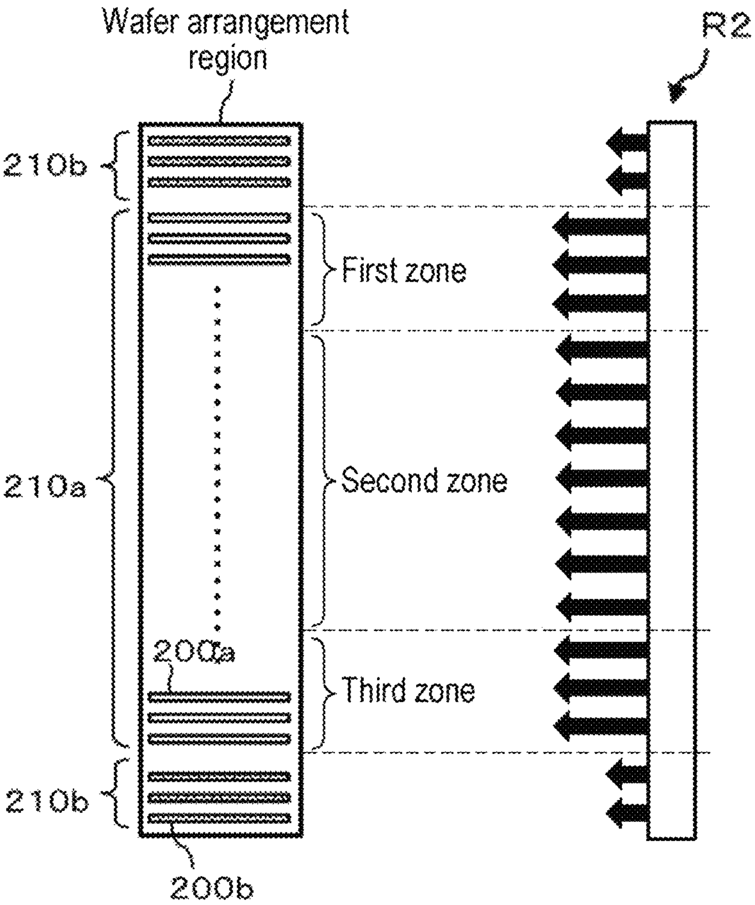

Step C in this modification may be performed by using the nozzle 249*b* (see FIG. 5) exemplified in the above-described embodiments and the nozzle 249*b* exemplified in FIGS. 7A to 7I. The nozzle 249*b* shown in FIG. 7I is configured such that the opening areas of the gas supply holes 250*b* per unit length in the direction perpendicular to the surface of the wafer 200 are smaller in the portions facing the second regions 210*b* than in the portion facing the first region 210*a*. Step C in this modification may be appropriately performed particularly by using the nozzle in which the gas supply holes 250*b* are formed in the portions facing the second regions 210*b*, such as the nozzle 249*b* (see FIG. 5) exemplified in the above-described embodiments and the nozzles 249*b* exemplified in FIGS. 7A to 7C, 7E, and 7G to 7I. By using the nozzle including the gas supply holes 250*b* in the portions facing the second regions 210*b*, it is easy to supply the dilution inert gas to the second regions 210*b* and regulate the concentration distribution (partial pressure distribution) of the first processing gas. Further, in this modification, as shown in FIG. 7I, the opening areas of the gas supply holes 250*b* per unit length in the direction perpendicular to the surface of the wafer 200 may not be larger in the portion facing the second zone than in the portions facing the first and third zones. The flow rate distribution of the inert gas injected from the gas supply holes 250*b* shown in FIG. 7I is as shown in FIG. 8E.

In this modification as well, at least a part of the same effects as those of the above-described embodiments may be obtained.

OTHER EMBODIMENTS OF THE PRESENT DISCLOSURE

The embodiments of the present disclosure are specifically described above. However, the present disclosure is not limited to the above-described embodiments, and various changes may be made without departing from the spirit of the present disclosure.

In the above-described embodiments, as the second processing gas, the precursor gas containing Si as a predetermined element are exemplified. However, the present disclosure is not limited thereto. For example, the present disclosure may be also applied to a case where a second processing gas containing a metal element such as aluminum (Al), titanium (Ti), hafnium (Hf), zirconium (Zr), tantalum (Ta), molybdenum (Mo), or tungsten (W) as a predetermined element is used, and an oxide film containing a metal element such as an aluminum oxide film (AlO film), a titanium oxide film (TiO film), a hafnium oxide film (HfO film), a zirconium oxide film (ZrO film), a tantalum oxide film (TaO film), a molybdenum oxide film (MoO film), or a tungsten oxide film (WO film) is formed on the wafer 200 by the above-described processing sequence. Further, the present disclosure may be also applied to a case where a first processing gas containing at least one selected from the group of nitrogen (N) and carbon (C) and a second processing gas containing the above-described metal element are used, and a nitride film or carbide film containing a metal element, such as an aluminum nitride film (AlN film), a titanium nitride film (TiN film), a hafnium nitride film (HfN film), a zirconium nitride film (ZrN film), a tantalum nitride film (TaN film), a molybdenum nitride film (MoN film), a tungsten nitride film (WN film), a titanium oxynitride film (TiON film), a titanium aluminum carbonitride film (TiAlCN film), a titanium aluminum carbide film (TiAlC film), or a titanium carbonitride film (TiCN film), is formed on the wafer 200 by the above-described processing sequence. In these embodiments as well, the same effects as those of the above-described embodiments may be obtained.

In the above-described embodiments, the case where the inert gas is supplied toward both the first zone and the third zone in step C are exemplified. However, the present disclosure is not limited thereto. For example, in some embodiments, the inert gas may be supplied toward either the first zone or the third zone. In these embodiments as well, the same effects as those of the above-described embodiments may be obtained.

In the above-described embodiments, the case where the dummy wafers 200*b* are arranged in the second regions 210*b* in step A is exemplified. However, the present disclosure is not limited thereto. For example, in some embodiments, the wafers may not be arranged in the second regions 210*b*. The second regions 210*b* may be spaces in which no wafer is arranged. In these embodiments as well, the same effects as those of the above-described embodiments may be obtained.

In the above-described embodiments, the case where the dummy wafers 200*b* are arranged in the second regions 210*b* in step A is exemplified. However, the present disclosure is not limited thereto. For example, in some embodiments, the arrangement interval (pitch) of the product wafers 200*a* arranged in the second regions 210*b* may be wider than the arrangement interval of the product wafers 200*a* arranged in the first region 210*a*. In other words, the surface areas per unit volume of the wafers existing in the second regions 210*b* may be smaller than the surface areas per unit volume of the wafers existing in the first region 210*a*. In these embodiments as well, the same effects as the above-described embodiments may be obtained.

In the above-described embodiments, the case where the dummy wafers 200*b* are used as the second substrates is exemplified. However, the present disclosure is not limited thereto. For example, in some embodiments, monitor wafers with smaller surface areas than the product wafers 200*a* may be used as the second substrates. In these embodiments as well, the same effects as those of the above-described embodiments may be obtained.

In the above-described embodiments, the case where the film formation process is performed as the substrate processing is exemplified. However, the present disclosure is not limited thereto. For example, in some embodiments, as the substrate processing, an etching may be performed by using an etching gas as the second processing gas. In these embodiments as well, the same effects as those of the above-described embodiments may be obtained.

In the above-described embodiments, the case where step B and step C are performed simultaneously (an execution period of step B and an execution period of step C coincide or overlap) is exemplified. However, the present disclosure is not limited thereto. For example, in some embodiments, step C may be started after a predetermined time elapses since the start of step B and before step B ends. In this way, the execution period of step B and the execution period of step C (the supply time of the first processing gas and the supply time of the dilution inert gas) may at least partially overlap. In these embodiments as well, the same effects as those of the above-described embodiments may be obtained.

The recipes used in the respective processes may be provided individually according to the processing contents and may be recorded and stored in the memory 121*c* via a telecommunication line or an external memory 123. Further, at the beginning of each process, the CPU 121*a* may properly select an appropriate recipe from a plurality of recipes recorded and stored in the memory 121*c* according to the process contents. The above-described recipes are not limited to the newly-provided ones but may be provided, for example, by changing existing recipes that are already installed in the substrate processing apparatus.

In the above-described embodiments, the example in which the film is formed by using the substrate processing apparatus including a hot-wall-type process furnace is described. The present disclosure is not limited to the above-described embodiments, but may be suitably applied to a case where a film is formed by using a substrate processing apparatus including a cold-wall-type process furnace. Further, in the above-described embodiments, the example in which the gas is activated by heat is described. However, the present disclosure is not limited thereto. For example, the present disclosure may be also suitably applied to a case where the gas is activated by plasma generated inside or outside the process chamber 201, or a case where the gas is activated by irradiating electromagnetic waves to the gas by a lamp or the like.

Even when these substrate processing apparatuses are used, each process may be performed under the same processing procedures and processing conditions as those of the above-described embodiments and modifications. The same effects as those of the above-described embodiments and modifications may be obtained.

The above-described embodiments and modifications may be used in combination as appropriate. In such a case, the processing procedures and processing conditions may be, for example, the same as the processing procedures and processing conditions of the above-described embodiments and modifications.

According to the present disclosure in some embodiments, it is possible to control a processing amount for a substrate such that a distribution of the processing amount becomes a desired distribution among a plurality of substrates.

While certain embodiments are described above, these embodiments are presented by way of example, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:

(a) arranging a plurality of first substrates, each including a surface on which a concave structure is formed, in multiple stages in a first region along a direction perpendicular to the surface;

(b) supplying a first processing gas toward at least a portion of the first region; and (c) supplying an inert gas different from the first processing gas toward the at least a portion of the first region, wherein the first region includes a first zone including one end of the first region, a third zone including the other end of the first region, and a second zone located between the first zone and the third zone, and wherein in (c), the inert gas is supplied toward the second zone and is supplied toward at least one selected from the group of the first zone and the third zone at a flow rate smaller than a flow rate of the inert gas supplied toward the second zone, or the inert gas is supplied toward the second zone and is not supplied toward the first zone and the third zone.

2. The method of claim 1, wherein in (b), the first processing gas is supplied from a first nozzle, and wherein in (c), the inert gas is supplied toward at least the second zone from one or more second nozzles different from the first nozzle.

3. The method of claim 1, further comprising:

(d) supplying a second processing gas, which contains a predetermined element and is different from the first processing gas, toward the first region, wherein (b), (c), and (d) are performed a predetermined number of times to form a film containing the predetermined element on each of the plurality of first substrates.

4. The method of claim 3, wherein in (c), the inert gas is supplied from an inert gas nozzle different from a first processing gas nozzle configured to supply the first processing gas and a second processing gas nozzle configured to supply the second processing gas.

5. The method of claim 4, wherein (c) is performed such that an execution period of (c) at least partially overlaps an execution period of (b), and wherein during an execution period of (d), the inert gas is supplied from the inert gas nozzle toward the second zone at a flow rate smaller than a flow rate of the inert gas supplied from the inert gas nozzle toward the second zone during the execution period of (b).

6. The method of claim 1, wherein (c) is performed such that an execution period of (c) at least partially overlaps an execution period of (b).

7. The method of claim 1, wherein (a) further includes arranging a second substrate with a surface area smaller than a surface area of each of the plurality of first substrates in a second region different from the first region.

8. The method of claim 7, wherein in (a), the second substrate is not arranged in the first region.

9. The method of claim 7, wherein in (c), the inert gas is supplied toward the second region at a flow rate smaller than the flow rate of the inert gas supplied toward the second zone, or the inert gas is not supplied toward the second region.

10. The method of claim 7, wherein in (c), the inert gas is supplied toward the second region at a flow rate smaller than the flow rate of the inert gas supplied toward the at least one selected from the group of the first zone and the third zone, or the inert gas is not supplied toward the second region.

11. The method of claim 7, wherein in (c), the inert gas is not supplied toward the first zone and the third zone, and the inert gas is supplied toward the second zone.

12. The method of claim 7, wherein in (c), the inert gas is not supplied toward the first zone, the third zone, and the second region.

13. The method of claim 7, wherein in (b), the first processing gas is supplied toward at least a portion of the second region.

14. The method of claim 1, wherein in (c), the inert gas is supplied to suppress physical adsorption of the first processing gas on the surfaces of the plurality of first substrates.

15. The method of claim 1, wherein in (b), temperatures of the plurality of first substrates are set to a room temperature or higher and 200 degrees C. or lower.

16. The method of claim 1, wherein the first processing gas is a gas containing oxygen.

17. The method of claim 1, wherein the first processing gas is a gas containing oxygen and hydrogen in one molecule.

18. A method of manufacturing a semiconductor device comprising the method of claim 1.

* * * * *